US012560646B2

(12) United States Patent　　　　(10) Patent No.: US 12,560,646 B2
Beeston et al.　　　　　　　　　　　(45) Date of Patent: Feb. 24, 2026

(54) FORM FACTOR EQUIVALENT LOAD TESTING DEVICE

(71) Applicant: ProGrAnalog Corp., Portland, OR (US)

(72) Inventors: Roger Beeston, Camas, WA (US); Christopher Poach, West Linn, OR (US); David Baretich, Aurora, OR (US)

(73) Assignee: ProGrAnalog Corp., Portland, OR (US)

( * ) Notice: Subject to any disclaimer, the term of this patent is extended or adjusted under 35 U.S.C. 154(b) by 226 days.

(21) Appl. No.: 18/155,617

(22) Filed: Jan. 17, 2023

(65) Prior Publication Data

US 2023/0228811 A1　　Jul. 20, 2023

Related U.S. Application Data

(60) Provisional application No. 63/380,219, filed on Oct. 19, 2022, provisional application No. 63/352,182, filed on Jun. 14, 2022, provisional application No. 63/300,215, filed on Jan. 17, 2022.

(51) Int. Cl.
　　*G01R 31/28*　　　　(2006.01)
(52) U.S. Cl.
　　CPC ................................ *G01R 31/2879* (2013.01)
(58) Field of Classification Search
　　CPC ............ G01R 31/2879; G01R 31/2806; G01R 31/281; G01R 31/2805; G01R 31/2817; G01R 31/70; G01R 31/71; G01R 31/07328
　　See application file for complete search history.

(56) References Cited

U.S. PATENT DOCUMENTS

| | | | |
|---|---|---|---|
| 2005/0035754 A1 | 2/2005 | Ho et al. | |
| 2007/0057720 A1* | 3/2007 | Hand .................... | H03F 3/2173 330/10 |
| 2010/0188073 A1 | 7/2010 | Rothberg et al. | |
| 2014/0361798 A1 | 12/2014 | Johnson et al. | |
| 2016/0259016 A1 | 9/2016 | Remnas et al. | |
| 2020/0333403 A1* | 10/2020 | Wang ................. | G01R 31/3271 |

FOREIGN PATENT DOCUMENTS

| | | |
|---|---|---|
| TW | 202113382 A | 4/2021 |

* cited by examiner

*Primary Examiner* — Lee E Rodak
*Assistant Examiner* — Demetrius R Pretlow
(74) *Attorney, Agent, or Firm* — Kolitch Romano Dascenzo Gates LLP

(57)　　　　ABSTRACT

An electronic load testing system is configured to emulate aspects of an integrated circuit (IC). A control module of the system is configured to be electrically coupled to a first location on a printed circuit board (PCB) of an electronic assembly, and a load module is configured to be electrically coupled to a second location on the PCB. The load module includes a load cell configured to selectively conduct current from a power supply of the electronic assembly. The first location and the second location are spaced apart and in electronic communication via one or more traces of the PCB. The control module is configured to communicate with the load module via the one or more traces of the PCB. In some examples, the load module and the IC have an equivalent form factor, such that the load module can be installed in place of the IC.

19 Claims, 17 Drawing Sheets

10

10

20

18

16

14

12

-- PRIOR ART --

-- PRIOR ART --

114

FORM FACTOR EQUIVALENT LOAD TESTING DEVICE

CROSS-REFERENCES

The following applications and materials are incorporated herein by reference, in their entireties, for all purposes: U.S. Provisional Patent Application Ser. No. 63/300,215, filed Jan. 17, 2022, U.S. Provisional Patent Application Ser. No. 63/352,182, filed Jun. 14, 2022, and U.S. Provisional Patent Application Ser. No. 63/380,219, filed Oct. 19, 2022

FIELD

This disclosure relates to systems and methods for electronic load testing. More specifically, the disclosed embodiments relate to electronic load testing of power components utilized in printed circuit boards.

INTRODUCTION

Electronic load testing is commonly utilized in the testing of power supplies, power distribution systems, voltage regulators, and other power circuits. Recent efforts have been made to bring electronic load testing to printed circuit boards (PCBs). For example, load testing systems have been developed for testing current and voltage regulator utilizes in PCBs, e.g., for digital signal processors (DSPs), central processing units (CPUs), graphics processing units (GPUs), field-programmable gate arrays (FPGAs), and other large integrated circuits (ICs) and/or multi-chip modules, such as physical layer (PHY) circuitry. As semiconductor technology advances and PCBs increase in complexity, the voltage and current requirements of ICs and other electronic modules also increase. Accordingly, load testing systems must be developed to ensure that the power systems, regulators, and other circuitry are adequately capable of meeting those requirements and reliably provide power to the system within expected tolerances.

Existing electronic load testing systems typically fall into two types. The first type of systems are those in which control circuitry of the testing system is fitted in the same assembly as the power load portion (e.g., an array of transistors). While this arrangement reduces overall complexity of the system, the form factor may present challenges in a tightly packed system. The second types of systems are those in which the power load portion is separated from the control circuitry. This allows for a smaller form factor that can better fit in a tight system. Additionally, this enables more current capacity, as it increases the number of power circuits that can fit in the available space. However, these systems often require a large multiconductor cable (e.g., a ribbon cable) to make connections between power load portion(s) and control circuitry. In a complex system (e.g., PCBs having many processors, GPUs, DSPs, FPGA, memory, etc., or systems employing multiple PCBs), this becomes ungainly and difficult to implement. Furthermore, as processors and similar ICs have very tightly specified power requirements, (e.g., transient current step requirements and/or impedance requirements), supply voltage must remain in specification while the IC current steps from lower currents to higher currents. As step size is often hundreds or even thousands of amperes in magnitude, current slew rates commonly exceed 1000 A/us. Accordingly, connections to an external load (e.g., utilizing a large-gauge cable or a ribbon cable) are too inductive to allow such slew rates. Thus, improvements to load testing systems are needed.

SUMMARY

The present disclosure provides systems, apparatuses, and methods relating to form factor testing devices.

In some examples, an electronic load testing system includes: a control module configured to be electrically coupled to a first location on a printed circuit board (PCB) assembly of an electronic assembly; and a load module configured to be electrically coupled to a second location on the PCB assembly, wherein the first location and the second location are spaced apart and in electronic communication via one or more traces of the PCB assembly; the load module comprising a load cell configured to mimic a load by selectively conducting current from a power supply of the PCB assembly, the load cell comprising a transistor and a current sense resistor; wherein the control module is configured to communicate with the load module via the one or more traces of the PCB assembly.

In some examples, a method of testing an electrical characteristic of an electrical system includes: transmitting a drive signal from a control module coupled to the electrical system at a first location to a gate of a transistor of a load cell coupled to the electrical system at a second location, wherein the first location and the second location are spaced apart and in electronic communication via one or more traces of the electrical system; measuring a voltage across a current sense resistor of the load cell using the control module via the one or more traces; and assessing the characteristic of the electrical system by comparing the measured voltage to an expected voltage.

In some examples, an electronic load testing system configured to emulate aspects of an integrated circuit (IC) includes: a control module configured to be electrically coupled to a first location on a printed circuit board (PCB) of an electronic assembly; and a load module configured to be electrically coupled to a second location on the PCB, the load module comprising a load cell configured to selectively conduct current from a power supply of the electronic assembly, the load cell comprising a transistor and a current sense resistor; wherein the first location and the second location are spaced apart and in electronic communication via one or more traces of the PCB; wherein the control module is configured to communicate with the load module via the one or more traces of the PCB; and wherein the load module and the IC have an equivalent form factor.

Features, functions, and advantages may be achieved independently in various embodiments of the present disclosure, or may be combined in yet other embodiments, further details of which can be seen with reference to the following description and drawings.

DETAILED DESCRIPTION

Figures 1, 2:
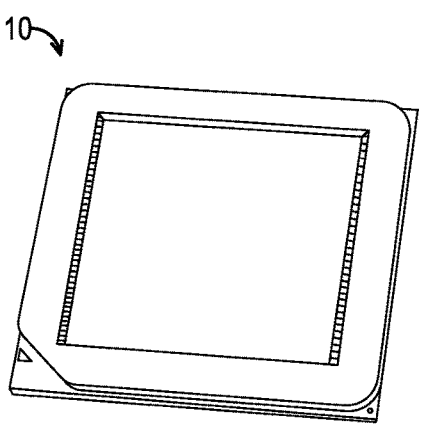
FIG. 1 depicts an illustrative example of an integrated circuit (IC).
FIG. 2 is an exploded view of the IC of FIG. 1.

Various aspects and examples of an electronic load testing system are described below and illustrated in the associated drawings. Unless otherwise specified, an electronic load testing system in accordance with the present teachings, and/or its various components, may contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

This Detailed Description includes the following sections, which follow immediately below: (1) Definitions; (2) Overview; (3) Examples, Components, and Alternatives; (4) Advantages, Features, and Benefits; and (5) Conclusion. The Examples, Components, and Alternatives section is further divided into subsections, each of which is labeled accordingly.

Definitions

The following definitions apply herein, unless otherwise indicated.

"Comprising," "including," and "having" (and conjugations thereof) are used interchangeably to mean including but not necessarily limited to, and are open-ended terms not intended to exclude additional, unrecited elements or method steps.

Terms such as "first", "second", and "third" are used to distinguish or identify various members of a group, or the like, and are not intended to show serial or numerical limitation.

"AKA" means "also known as," and may be used to indicate an alternative or corresponding term for a given element or elements.

"DUT" means "device under test."

"FFED" means "form factor equivalent device."

"IC" means "integrated circuit."

"PCB" means "printed circuit board."

"DSP" means "digital signal processor."

"CPU" means "central processing unit."

"GPU" means "graphics processing unit."

"FPGA" means "field-programmable gate array."

"DAC" means "digital-to-analog converter."

"ADC" means "analog-to-digital converter."

"DIMM" means "dual in-line memory module."

"CS" means "current sense."

"Coupled" means connected, either permanently or releasably, whether directly or indirectly through intervening components.

"Processing logic" describes any suitable device(s) or hardware configured to process data by performing one or more logical and/or arithmetic operations (e.g., executing coded instructions). For example, processing logic may include one or more processors (e.g., central processing units (CPUs) and/or graphics processing units (GPUs)), microprocessors, clusters of processing cores, FPGAs (field-programmable gate arrays), artificial intelligence (AI) accelerators, digital signal processors (DSPs), and/or any other suitable combination of logic hardware.

A "controller" or "control module" or "electronic controller" includes processing logic programmed with instructions to carry out a controlling function with respect to a control element. For example, an electronic controller may be configured to receive an input signal, compare the input signal to a selected control value or setpoint value, and determine an output signal to a control element (e.g., a motor or actuator) to provide corrective action based on the comparison. In another example, an electronic controller may be configured to interface between a host device (e.g., a desktop computer, a mainframe, etc.) and a peripheral device (e.g., a memory device, an input/output device, etc.) to control and/or monitor input and output signals to and from the peripheral device.

"Providing," in the context of a method, may include receiving, obtaining, purchasing, manufacturing, generating, processing, preprocessing, and/or the like, such that the object or material provided is in a state and configuration for other steps to be carried out.

In this disclosure, one or more publications, patents, and/or patent applications may be incorporated by reference. However, such material is only incorporated to the extent that no conflict exists between the incorporated material and the statements and drawings set forth herein. In the event of any such conflict, including any conflict in terminology, the present disclosure is controlling.

5
Overview

In general, a form factor equivalent load testing device (FFED) of the present disclosure is configured to evaluate performance of PCBs and other electronic devices for use with integrated circuits (ICs), such as microprocessors, GPUs, FPGAs, DSPs, and the like. The FFED is configured to be form-equivalent, fit-equivalent, and function-equivalent for the intended evaluations. In other words, the FFED is configured to closely match the dimensions and operating parameters of an IC to evaluate the capabilities of the PCB to meet the minimum operating requirements of the IC. These evaluations include load testing of power management and other evaluations such as internal and external power distribution impedance, decoupling, clock timing, data transferring, and thermal management. These evaluations can be performed either individually or interactively among themselves, as well as with other, externally provided testing. Such electronic load testing systems may be utilized in testing PCB level voltage regulators for computing loads such as servers, desktop, mobile, DSP, FPGA, GPU, memory, and similar applications.

Electronic load testing systems described herein include at least one control module (also referred to as control circuitry) and at least one load module (also referred to as power circuitry). The control module and load modules of testing systems of the present disclosure are configured to be mounted directly to the PCB, e.g., utilizing existing sockets or soldered directly to the board. In a typical PCB, there are various interconnects between different ICs and modules, commonly referred to as traces or buses. For example, a processor may be in electronic communication with a memory module and/or other circuitry around the PCB, via one or more buses. The control module and the load module of the FFED are configured to utilize these existing PCB bus connections to communicate with each other.

As the performance of a power source can be highly dependent on the number and layout of ICs/modules, placing the load tester directly onto the PCB (i.e., in a socket or soldered down), rather than connected via one or more external cables, facilitates testing, tuning, and optimizing of the voltage source with all its components in place. For example, PCBs can have a variety of inherent parasitic resistances, capacitances, and inductances that can greatly affect response, and verifying performance under these actual conditions ensures that the boards will consistently meet specifications.

Furthermore, large ICs (such as CPUs, GPUs, etc.) may have multiple power inputs requiring varying voltages and currents. In some cases, a large IC may pull more current through specific power pins depending upon the internal layout of the IC or module. A multiple channel, socket/board level electronic load tester can test for these complex requirements. Multiple FFEDs may be optionally employed to test a complete interactive board power distribution and voltage regulator system. Systems and methods configured to test power systems are described below.

Additionally, since form factor equivalent load testers of the present disclosure may have substantially identical (or substantially similar) dimensions to the IC the tester is meant to mimic and also may comprise the same (or substantially similar) materials and construction as the IC, the load testers have the same (or substantially similar) thermal properties. Therefore, since the load used in the tester is substantially similar to the IC load, having a form factor equivalent device facilitates highly accurate testing and validating of the thermal management system of the PCB.

An additional benefit of FFEDs of the present disclosure is the use of fast internal switching (e.g., rise and fall times of 1 ns or lower) within the device. Fast internal switching may be used to evaluate and improve capacitive decoupling inside the IC package, and interactions with power pins, ground pins, and external components may be tested. As clock jitter may be affected by large, fast transient currents in an IC, clock timings may be evaluated using the FFED by simulating these fast transient currents. Multiple tests may be performed in each of these areas, both individually and in combination (e.g., interactively), to add robustness to the testing and evaluation effort.

Aspects of the electronic load testing systems of the present disclosure may be embodied as a computer method, computer system, or computer program product. Accordingly, aspects of the system may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of the system may take the form of a computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random-access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a computer-readable storage medium may include any suitable non-transitory, tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, RF, and/or the like, and/or any suitable combination of these.

Computer program code for carrying out operations for aspects of the electronic load testing system may be written in one or any combination of programming languages, including an object-oriented programming language (such as Java, C++), conventional procedural programming languages (such as C), and functional programming languages (such as Haskell).

Mobile apps may be developed using any suitable language, including those previously mentioned, as well as Objective-C, Swift, C#, HTML5, and the like. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), and/or the connection may be made to an external computer (for example, through the Internet using an Internet Service Provider).

Aspects of the testing system may be described below with reference to flowchart illustrations and/or block diagrams of methods, apparatuses, systems, and/or computer program products. Each block and/or combination of blocks in a flowchart and/or block diagram may be implemented by computer program instructions. The computer program instructions may be programmed into or otherwise provided to processing logic (e.g., a processor of a general purpose computer, special purpose computer, field programmable gate array (FPGA), or other programmable data processing apparatus) to produce a machine, such that the (e.g., machine-readable) instructions, which execute via the processing logic, create means for implementing the functions/acts specified in the flowchart and/or block diagram block(s).

Additionally or alternatively, these computer program instructions may be stored in a computer-readable medium that can direct processing logic and/or any other suitable device to function in a particular manner, such that the instructions stored in the computer-readable medium produce an article of manufacture including instructions which implement the function/act specified in the flowchart and/or block diagram block(s).

The computer program instructions can also be loaded onto processing logic and/or any other suitable device to cause a series of operational steps to be performed on the device to produce a computer-implemented process such that the executed instructions provide processes for implementing the functions/acts specified in the flowchart and/or block diagram block(s).

Any flowchart and/or block diagram in the drawings is intended to illustrate the architecture, functionality, and/or operation of possible implementations of systems, methods, and computer program products according to aspects of the testing system. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

EXAMPLES, COMPONENTS, AND ALTERNATIVES

The following sections describe selected aspects of illustrative electronic load testing systems as well as related systems and/or methods. The examples in these sections are intended for illustration and should not be interpreted as limiting the scope of the present disclosure. Each section may include one or more distinct embodiments or examples, and/or contextual or related information, function, and/or structure.

A. ILLUSTRATIVE ELECTRONIC LOAD TESTING SYSTEM

This section describes an illustrative testing system 100 (see FIGS. 7-15). System 100 is a form factor equivalent device (FFED) configured to test and verify performance of support systems for integrated circuits (ICs). System 100 is an example of the form factor equivalent devices described above.

An illustrative IC 10 is depicted in FIGS. 1 and 2. In general, IC 10 may be constructed of either large single die devices or of multiple dies mounted and connected in a single package. For example, IC 10 may include one or more microprocessors, central processing units (CPUs), floating-point units (FPUs), graphics processing units (GPUs), artificial intelligence (AI) processors, digital signal processors (DSPs), field programmable gate arrays (FPGAs), or any other physical layer, and/or combination thereof. As computer systems become more powerful, large ICs such as these continue to increase in complexity and size. This increase in complexity and size comes with the need for more robust support systems, such as power sources, decoupling solutions, thermal management systems, clocking, data, etc.

Regarding power sources, during operation large ICs such as IC 10 may require currents ranging from zero amperes up to several hundreds or thousands of amperes. In some examples, current may step quickly from low values to high value, with step size approaching the maximum current rating with edge times of less than 1 $\mu$s. Compounding these issues are tight regulation requirements necessary for high-performance operation. For example, if the voltage sags too low, even briefly, the IC may not function properly. Conversely, if the voltage goes too high, the IC may overheat or fail due to overvoltage.

Voltage regulators that meet these requirements can be complex, and may employ up to 24 phases or more. Accordingly, control is complex and significant expense may be incurred. Likewise, testing these voltage regulators is challenging, requiring high current load units with fast load step ability to simulate current consumption of a large IC.

Turning to FIG. 2, an illustrative construction of IC 10 is shown. Generally, IC 10 comprises a bottom solder ball layer 12 (also referred to as a ball grid array (BGA)), a multilayer substrate 14 with power, return, and signal connections, various die layers 16, a thermal interface layer 18, and an integrated heat spreader (IHS) lid 20. In general, the number and type of die layers depends on the particular functionality required by the IC. In some cases, one die is sufficient, while in other cases multiple dies may be used.

Bottom solder ball layer 12 typically enables a connection between substrate 14 and a PCB, e.g., utilizing a reflow process. This connection could be directly to the main PCB or to an interconnect land grid array (LGA) PCB, or to a pin grid array (PGA) package. There are numerous other variations to general IC construction, as will be appreciated by those skilled in the art.

Regarding electrical characteristics, due to the conductive properties of multilayer substrate 14 and BGA layer 12, these layers impart electrical properties such as impedance, inductance, resistance, capacitance, transmission line, skin effect, etc., to connections to the main PCB, for both power and signal connections. Other electrical properties may be imparted if an LGA or PGA socket is used for mounting the IC.

Figure 3:
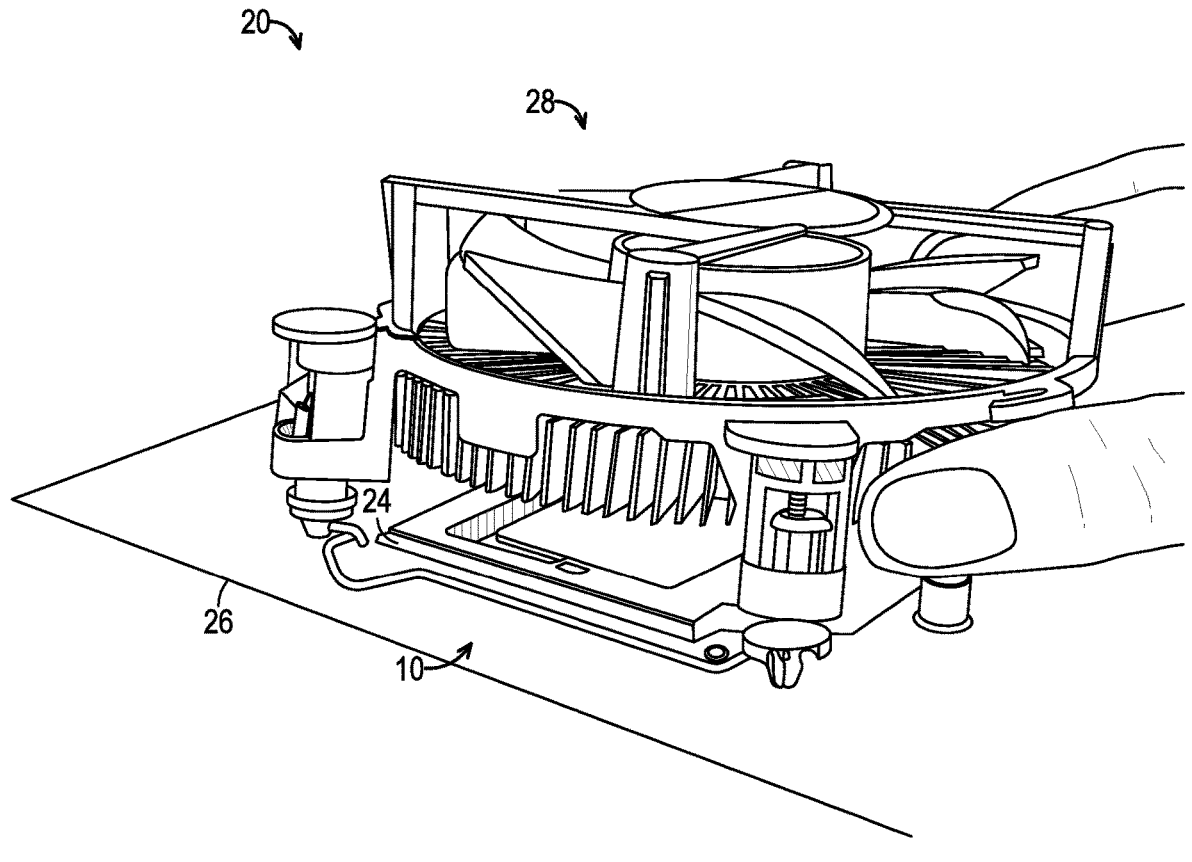
FIG. 3 depicts the IC of FIG. 1 installed on a printed circuit board (PCB).

While some heat will be transferred out of the bottom layer, most heat generated during operation is conducted out of the top of the IC through the use of thermal interface layer 18. Additional heat conductivity is provided by IHS lid 20, which also functions as the top of the IC package. Generally, IHS lids are constructed out of copper, aluminum, or other suitable heat conducting material. FIG. 3 depicts IC 10 installed in a system 22. In this example, IC 10 is mounted in a socket 24 of a PCB 26 below with a heat sink/cooling system 28 above.

Figure 4:
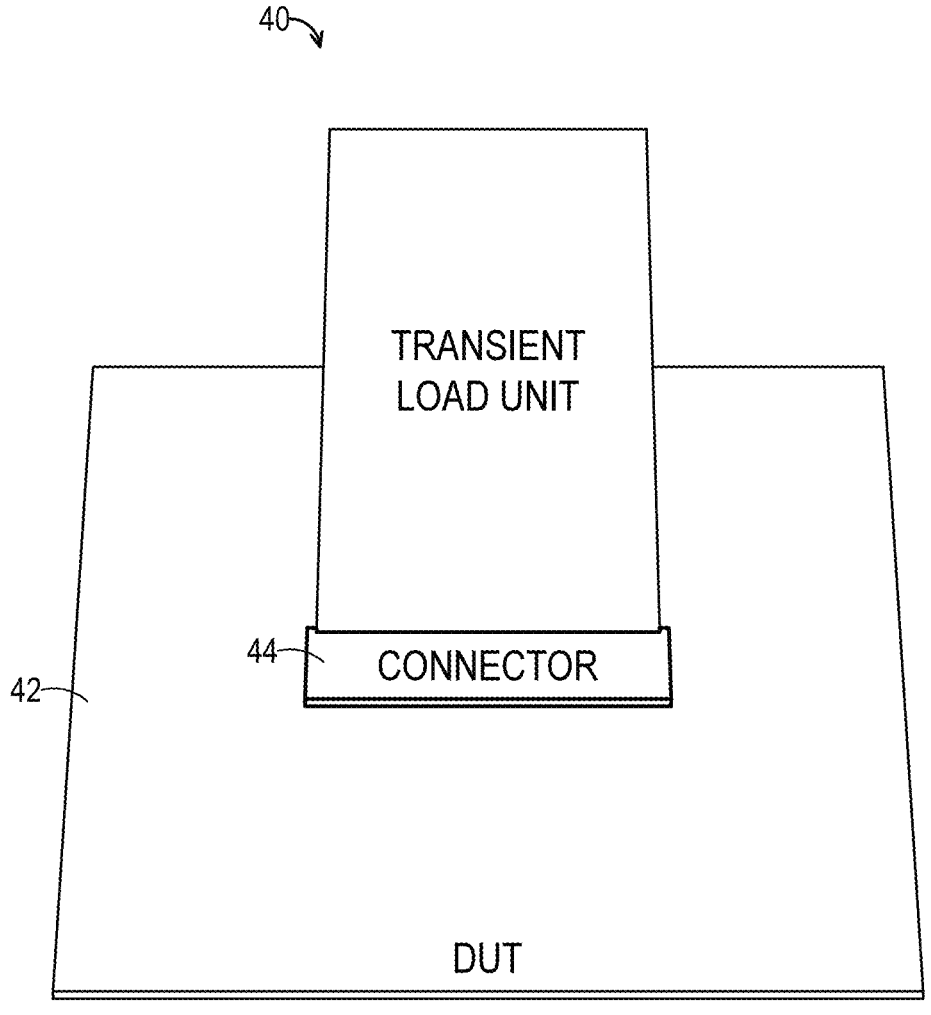
FIG. 4 is a schematic diagram of a load testing unit with an integrated power circuit and control circuit configured to plug into a socket on a PCB.

Turning to FIG. 4, an example of a known electronic load testing system 40 is depicted having a control module (also referred to as control circuitry) and a load module (also referred to as load circuitry or load portion) integrated together within the same assembly. Load testing system 40 is configured to connect to a device under test (DUT) 42 (here, a PCB) via a surface mounted connector 44, such as a PCB socket. As described above, this arrangement may help to reduce overall build complexity but presents challenges in a tightly packed system.

Figure 5:
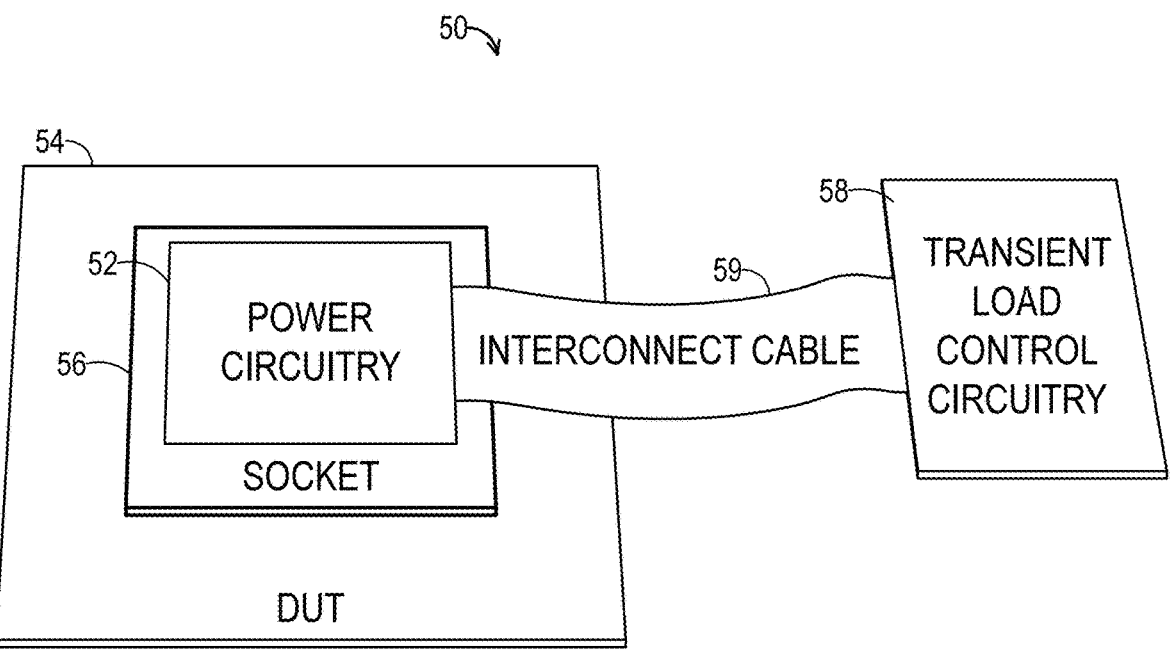
FIG. 5 is a schematic diagram of a load testing unit having a control circuit connected to a power circuit via an interconnect cable.

Turning to FIG. 5, a second known testing system 50 is depicted. In this example, a load module 52 is disposed on a DUT 54 (i.e., a PCB) via a socket 56. Load module 52 is in electronic communication with a control module 58 via an interconnect cable 59. As described above, this arrangement provides a smaller form factor and the capacity for more current. However, due to the necessity of interconnect cable 59, system 50 gets more difficult to implement as the complexity of DUT 54 increases. Additionally, systems such as system 50 which utilize an external cable for connections may be too inductive to allow for the slew rates found in sufficiently powerful systems (e.g., systems utilizing extremely fast control signals and/or high-speed digital signals).

Figure 6:
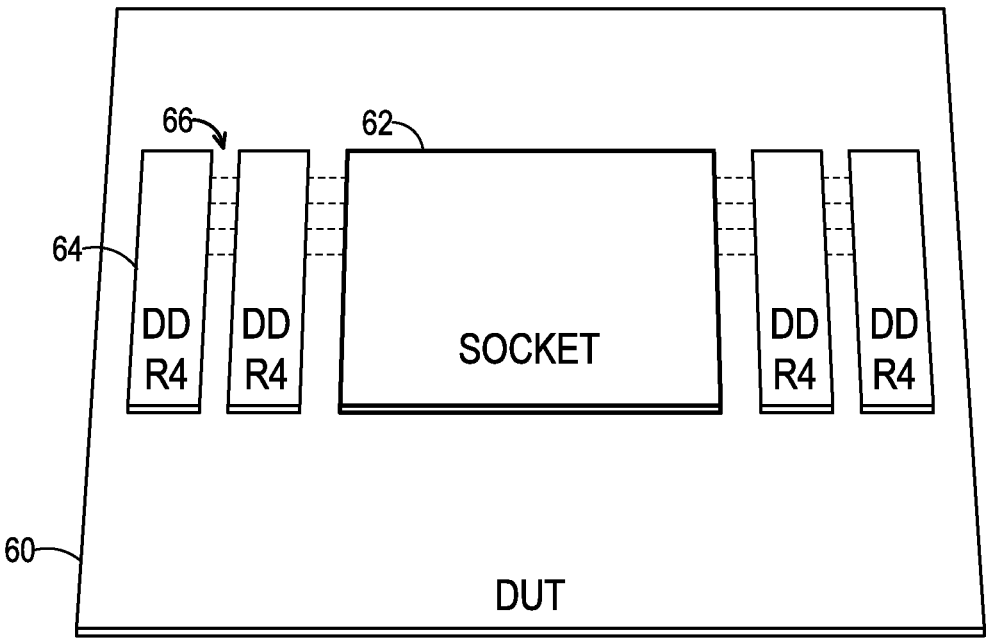
FIG. 6 depicts a schematic view of a printed circuit board (PCB) having multiple DDR4 DIMM sockets and a processor socket in communication via one or more buses.

A solution to the problems presented by systems 40 and 50 is provided by testing systems of the present disclosure through utilizing common structures present in all modern PCBs. Turning to FIG. 6, a simplified schematic view of a PCB 60 is shown having a processor socket 62 (e.g., utilized by an IC) in communication with a plurality of memory sockets 64 (in this example, DDR4 sockets) via a plurality of traces 66 herein referred to as a bus. In this example, electrical communication is possible by sending electrical signals down one or more of the traces of bus 66.

In general, system 100 is constructed to recreate the operating parameters and requirements of an IC in which it is meant to mimic. For example, system 100 may have substantially similar dimensions, thermal properties, power, ground, clock connections/timings, etc. Accordingly, system 100 is configured to fit in the same physical space as the IC and be virtually indistinguishable from the IC from the perspective of the DUT. Accordingly, system 100 can test and verify the functions of the DUT more realistically and accurately.

Figure 7:
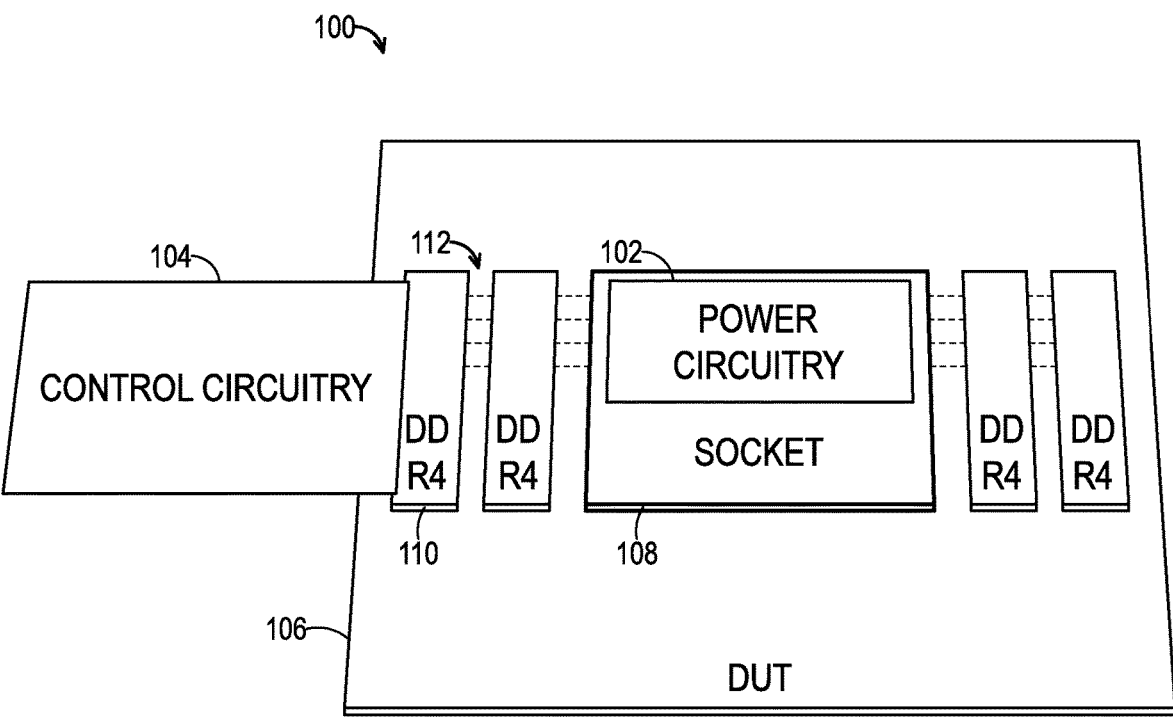
FIG. 7 is a schematic view of an illustrative electronic load testing system comprising a control circuit and a power circuit installed in the PCB of FIG. 6.

As shown in FIG. 7, system 100 includes a load module 102 (also referred to as power circuitry, power unit, and/or load unit) and a control module 104 (also referred to as a controller, control circuitry, and/or control unit). Load module 102 is connected directly to a DUT 106 (in this example, the DUT is a PCB substantially similar to PCB 60) via a processor socket 108. In some examples, the load module is connected to the DUT via another type of socket and/or via soldering, or other suitable method. Control module 104 is connected to at least one of DDR4 sockets 110 and is in electronic communication with the load unit via bus 112.

In a typical DDR4 bus, there are sixty-four traces connecting the DDR4 socket to the processor socket. If a processor and memory module are not installed, those sixty-four traces are available for communication and control between the DDR4 socket and the processor socket. Other connections between the processor socket and other PCB modules further add to the available signal lines. As these available connections are often high-speed digital buses, they are compatible with both analog and digital signals—both of which may be utilized via system 100.

In general, system 100 may receive electrical power via one or more power supplies and/or power sources including an external power supply, e.g., provided via an external power cable, a combined power and data cable (e.g., a universal serial bus (USB) cable, IEEE 1394 (also referred to as FireWire) cable, Thunderbolt cable, etc.), or other suitable connection. In some examples, the one or more power sources may be an onboard power supply such as one or more batteries, one or more photovoltaic cells, or other suitable onboard power supplies. In some examples, system 100 may receive power via one or more power layers (also referred to as power rails) of the PCB.

In some examples, system 100 is in communication with other electronic devices (e.g., personal computer(s), server(s), personal devices such as smartphones, etc.) to provide data related to tested parameters, e.g., for reference, recording, analysis, measurement, etc. Communication may be provided through a wired connection or a wireless connection. The wired connection may comprise an ethernet cable or other cable suitable for data transfer. The wireless connection may comprise a Bluetooth connection, Wi-Fi connection, wireless mesh network, and/or wireless sensor network. In some examples, communication may be provided through a cable comprising optical fiber (also referred to as a fiber-optic cable).

Figure 8:
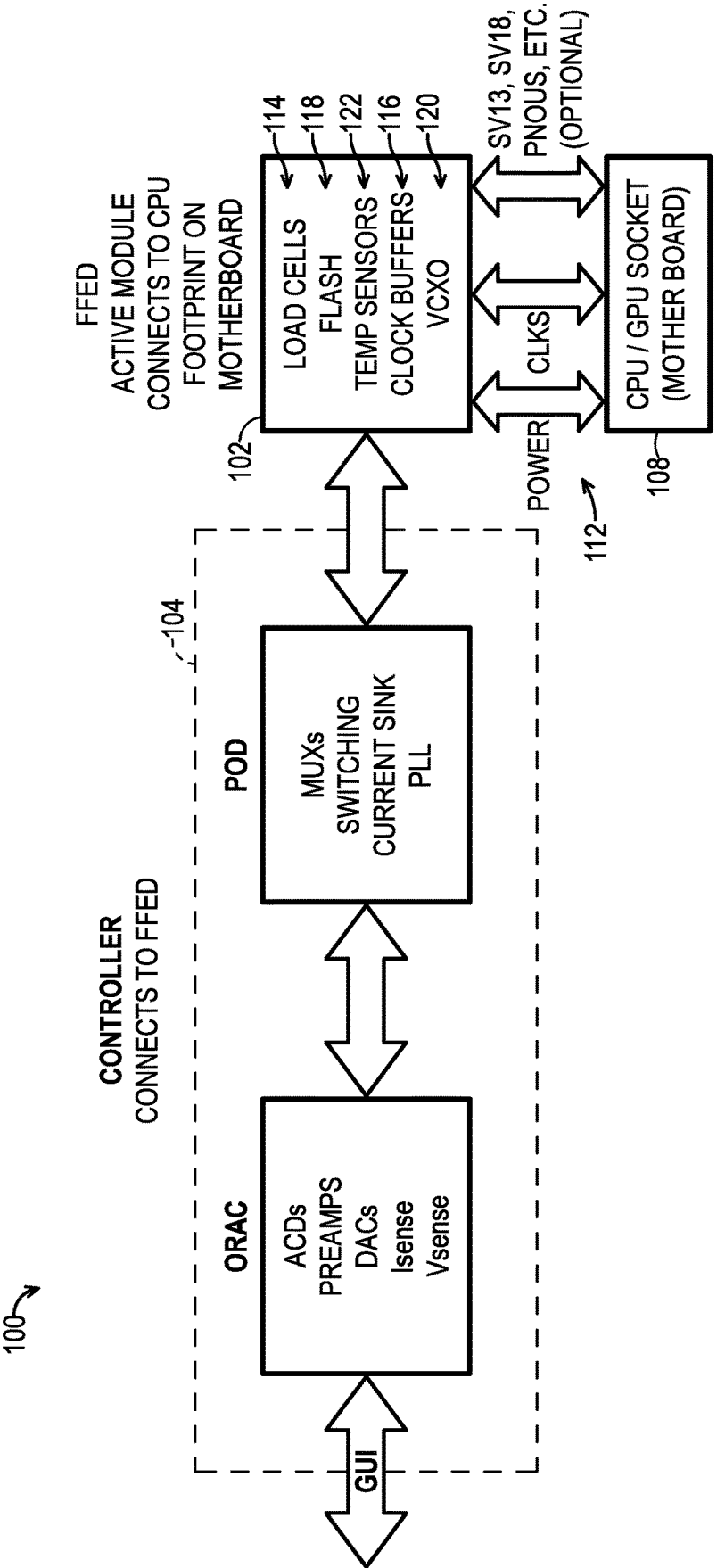
FIG. 8 is a block diagram depicting aspects of the electronic load testing system of FIG. 7 in accordance with aspects of the present disclosure.
Figure 9:
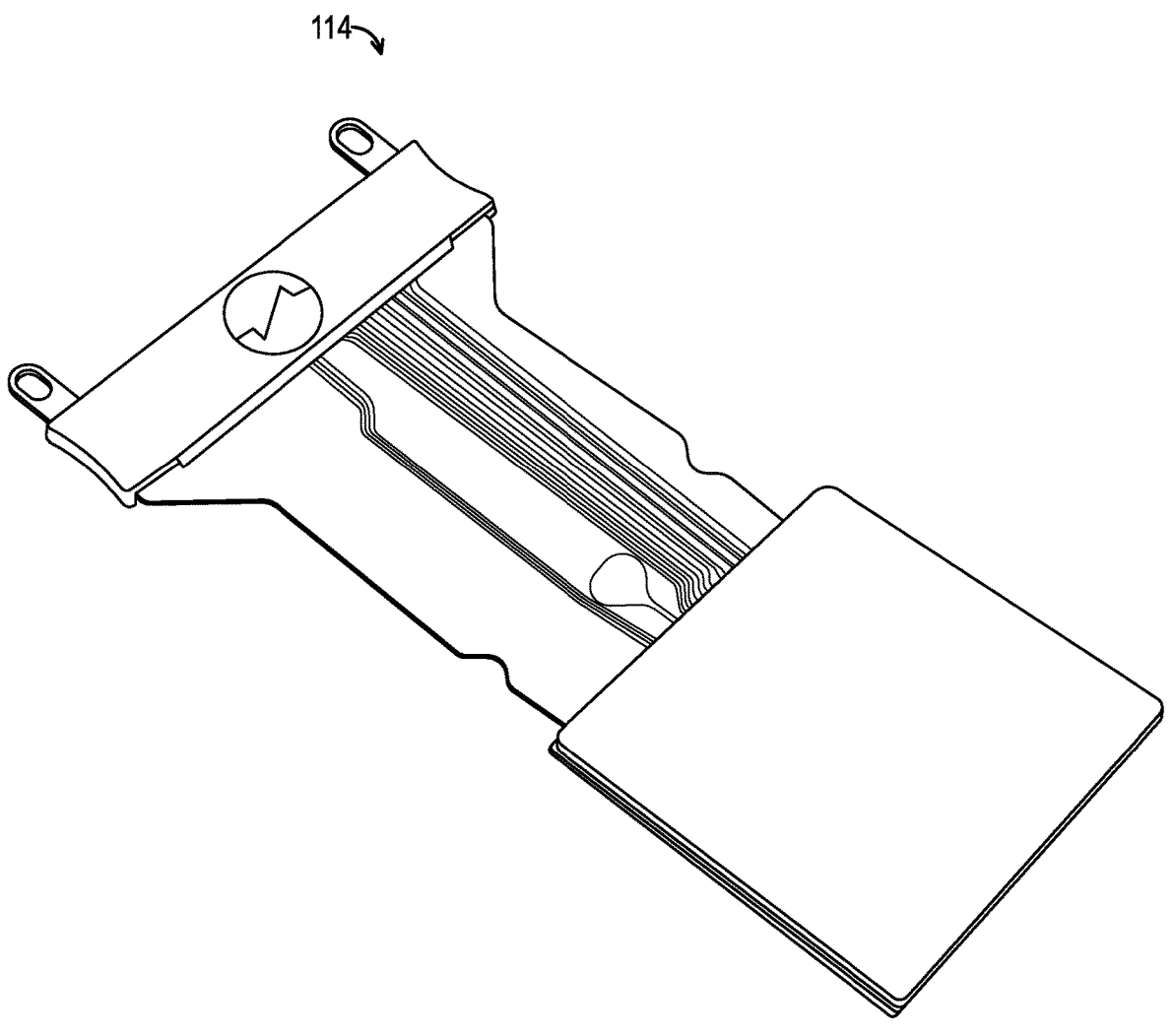
FIG. 9 is an example of a load unit for use with the electronic load testing system of FIG. 7.

Turning to FIG. 8, a block diagram is shown depicting aspects of system 100. In this example, system 100 may include, but is not limited to, the following: load cell(s) 114 including both main load cells and very fast load cell(s), a clock (not shown), clock buffer(s) 116, flash memory 118, a voltage-controlled crystal oscillator (VCXO) 120, one or more temperature sensors 122, one or more substrate capacitors, and a plurality of connection lines 124, such as one or more data bus connections, package pins, power connections, clock connections, and communication bus connections. As described above, system 100 may have additional components and material is similar to an IC (e.g., shown in FIGS. 1, 2), including a BGA or LGA compatible bottom layer, a substrate layer, a thermal interface material, and an integrated heat spreader.

System 100 is referred to as a form-factor equivalent device. In general, "form-factor equivalent" means that a selected set of physical dimensions of the device are the same as the corresponding dimensions of the IC the system is meant to emulate. For example, system 100 may have the same footprint (i.e., X-Y dimensions) as the IC within a given tolerance (e.g., +/−5% or +/−3% to 5%). Additionally or alternatively, system 100 may have the same height (i.e., Z dimension) as the IC, e.g., within the same tolerance. In some examples, form-factor equivalent means having a footprint substantially identical to the footprint of the IC, such that system 100 mounts to same socket, and a height that allows for system 100 to avoid interference with (e.g., fit under or within) preexisting components such as a PCB socket latch/retainer and/or a cooling solution. In some examples, a form-factor equivalent device has at least the same power and ground pins as the emulated device. In some examples, a form-factor equivalent device has thermal properties similar to the emulated device, e.g., a form-factor equivalent device may have a thermal conductivity within 10% of the thermal conductivity of the IC.

With respect to electrical functions, load cells 114 (such as main load cells and very fast load cells) are used to test the external power domain network (PDN) of DUT 106 as well as the internal distribution and decoupling network of DUT 106.

The high current load cells are controllable current sources that can load the PDN to full current and beyond to measure PDN capabilities and limitations. Because they are mounted within the form-factor equivalent construction of system 100, they can create transients in a more realistic environment than load units of non-form-factor equivalent testing systems.

For example, system 100 can test the PDN more realistically and accurately because it uses the same parasitic package components as part of its testing. Similarly, system 100 can test internal IC decoupling by using similar layout, e.g., utilizing load cells where processor or other cores are located, along with similar decoupling capacitors and placement. Moreover, because of this, the overall impedance and frequency response of the entire power network may be tested as an integrated whole, such as it will be used in production.

In some examples, system 100 may test power and ground plane solutions by separately controlling various load cells 114 in system 100. High current power and ground pins come in at the bottom of an IC circuit board in arrays and then pass through to a substrate for distribution in the IC. A set of load cells in system 100 may be operated in parallel for an overall loading, or they may be operated individually or offset in current from each other. By using multiple voltage measurement points on the power and ground planes, both planes can be characterized and evaluated for impedance. This characterization can be extended to the system PCB power and ground planes under the IC socket, allowing for a more optimized and effective PDN copper and socket pin pattern.

To illustrate the benefit of many control lines, descriptions of different architectures and example embodiments of system 100 are described below with reference to FIGS. 10-15.

Figure 10:
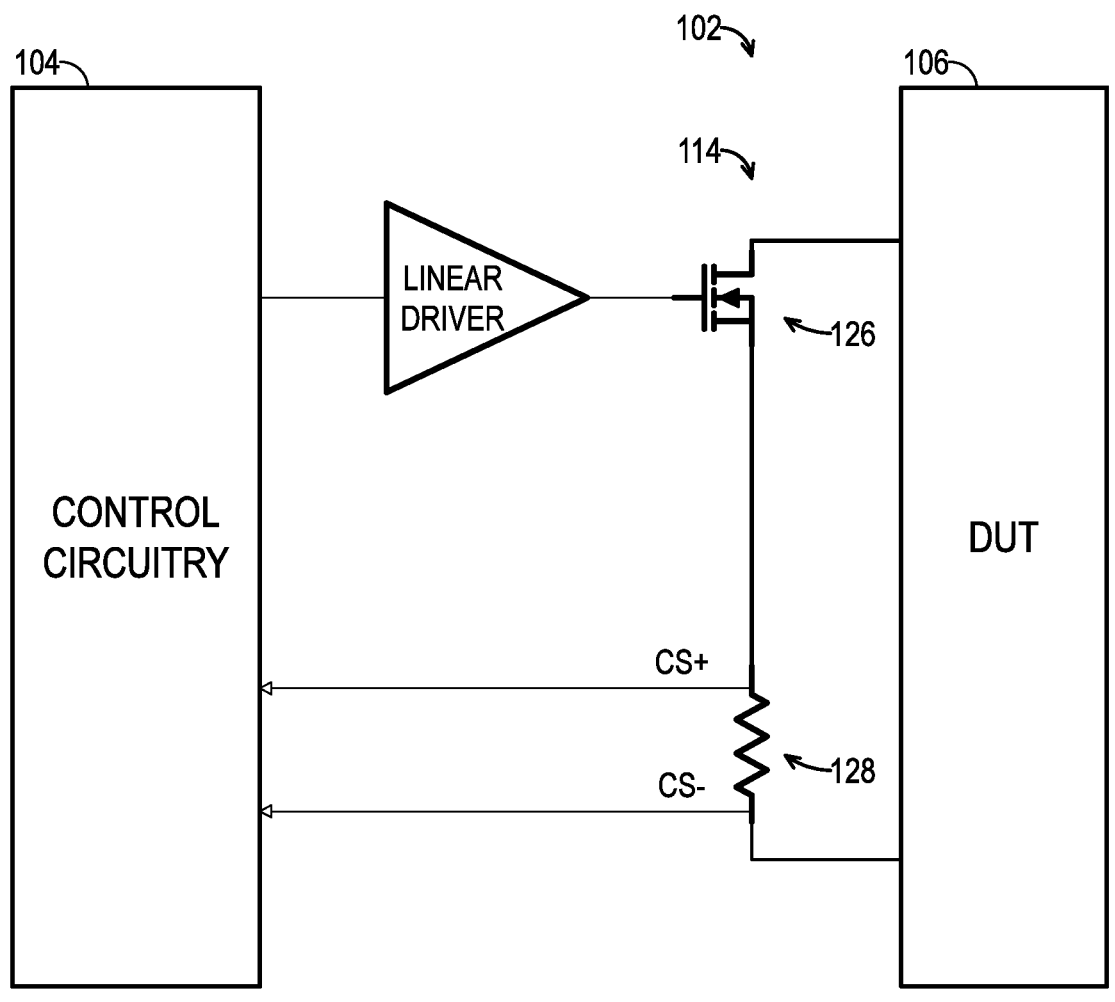
FIG. 10 depicts an illustrative load cell for use with the electronic load testing system of FIG. 7.

As shown in FIG. 10, load module 102 is depicted having a single load cell 114 comprising a transistor 126 (e.g., a metal-oxide semiconductor field-effect transistor or MOSFET) and a current sense resistor 128 (also referred to as a current shunt), with load module 102 being in communication with control module 104. The control method utilized by control module 104 may include any analog, digital, or mixed signal method of operating the gate voltage to turn MOSFET 126 on, off, and/or to regulate at a given current level. In this example, control module 104 is located away from load cell 114 (e.g., connected to memory socket 110) and communicates via PCB bus 112.

In operation, load current is sensed by measuring the voltage across current resistor 128, for example via CS+ and CS−. This voltage is sensed differentially for accuracy at high currents, fed back to control module 104, and compared to a reference signal to regulate MOSFET current to a reference value.

To achieve high current levels (e.g., in the hundreds to thousands of amperes), many load cells may be operated in parallel. In the example depicted in FIG. 10, there are three signal connections between control module 104 and load module 102 for the load cell 114. Due to the limitations imparted by the number of traces in bus 112, the number of load cells 114 is limited for a given set of signal lines.

The gate threshold voltage for the vast majority of MOSFETs has a negative temperature coefficient. Accordingly, as power dissipation increases, current increases for the same gate voltage. As a result, with two or more MOSFETs in parallel, one will be hotter due to current imbalance, conduct more and more current, and potentially experience thermal runaway and failure. Accordingly, simply paralleling MOSFET devices does not work well in a linear application.

Figure 11:
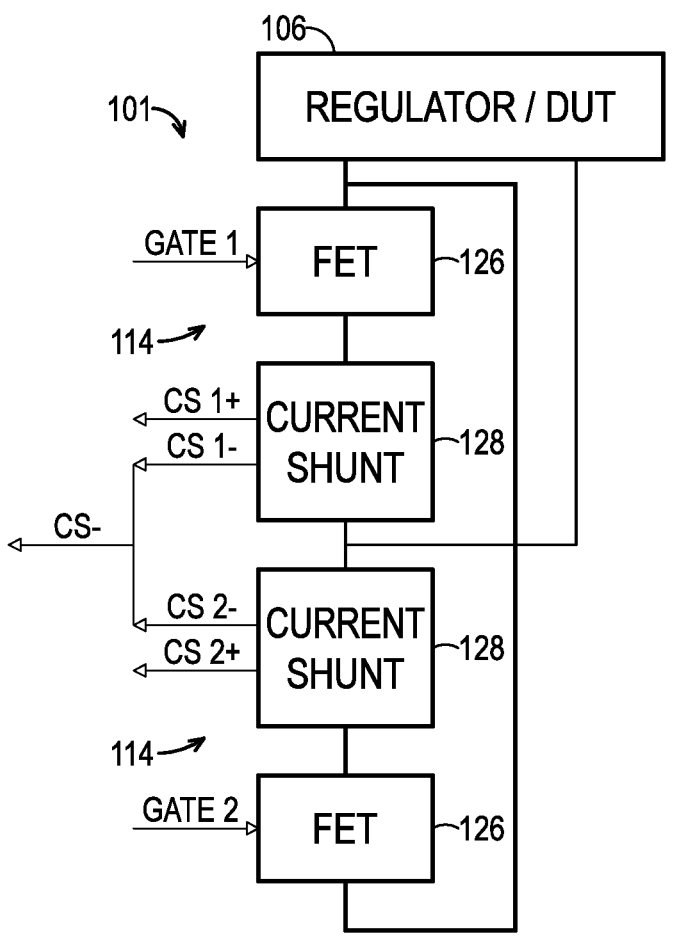
FIG. 11 depicts an arrangement of two load cells having a common connection for current sense return for use with the electronic load testing system of FIG. 7.

To alleviate these issues while still providing a larger current source, the transistor devices and current shunts may be connected in the manner depicted in FIG. 11. This arrangement is, in part, accomplished by using a single negative current sense (CS−) connection for multiple cells. As shown in FIG. 11, two load cells 114 are laid out in mirror symmetry with current sense resistors 128 in close proximity to each other. The two negative current sense connections (i.e., CS 1− and CS 2−) are combined into a single CS− signal. This arrangement advantageously results in five connections for two cells instead of six as utilized in the previous example, effectively dropping the number of connections per cell in an array of load cells to 2.5.

Figure 12:
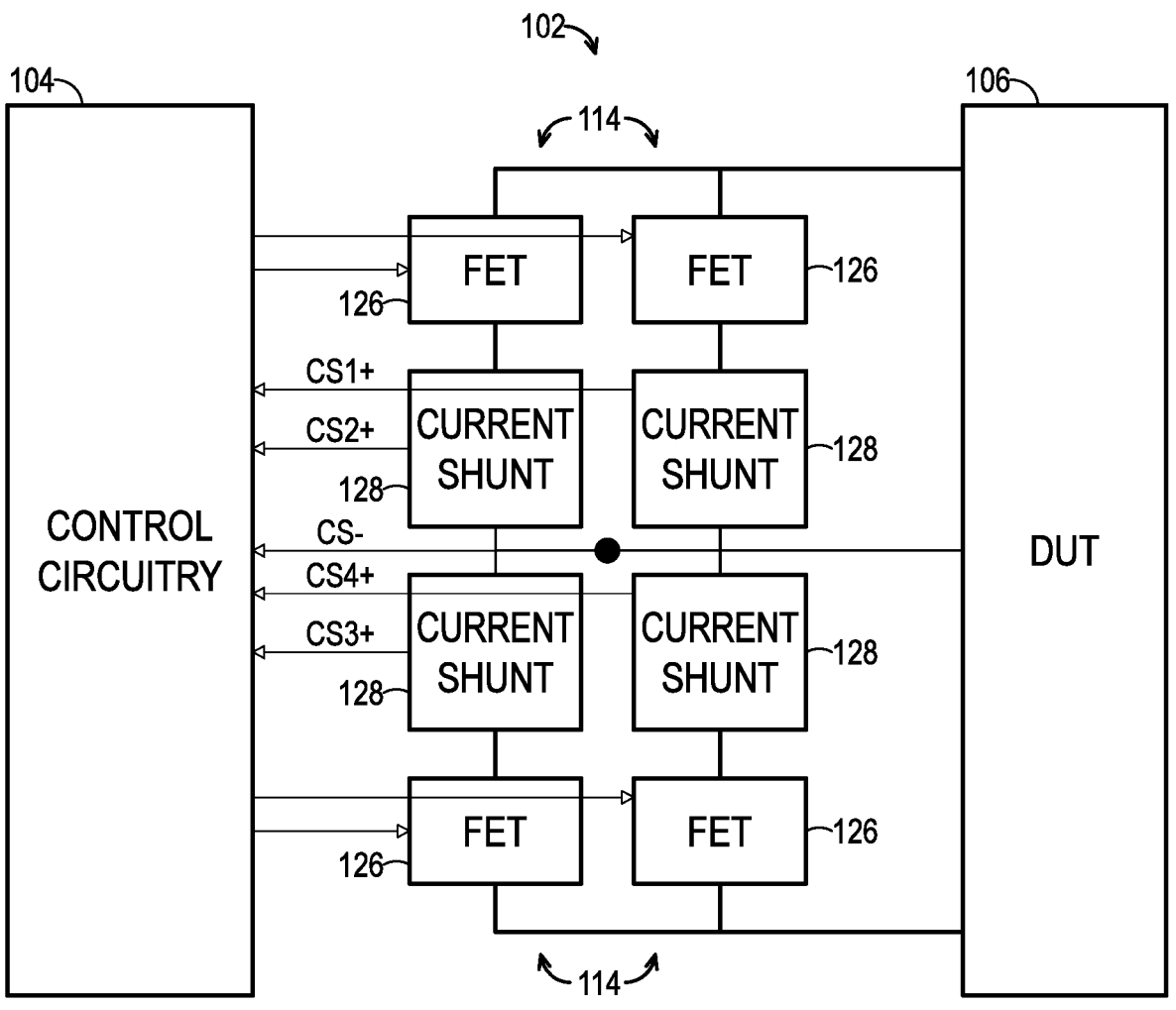
FIG. 12 depicts an example of four load cells having a common connection for current sense return for use with the electronic load testing system of FIG. 7.

In a similar manner, four cells may be placed closely together on the board as depicted in the example of FIG. 12, with a single CS− signal. Accordingly, four cells can be reduced from twelve required connections to nine. For a 64-line bus (such as those present between memory modules and processor sockets), up to twenty-eight individually controlled load cells are enabled by this configuration, corresponding to 2.25 connections per load cell.

Figure 13:
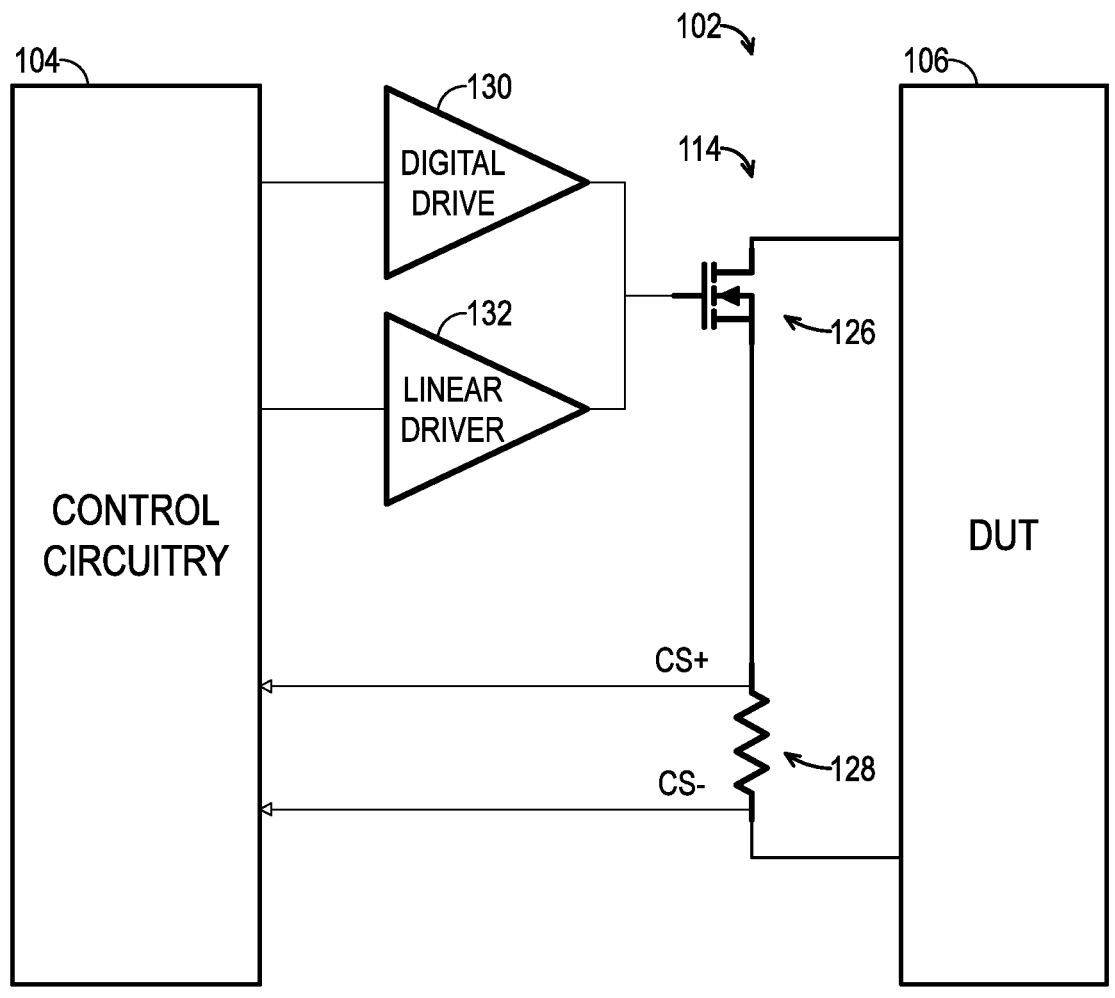
FIG. 13 depicts an example of a load cell having a linear gate drive and a digital gate level shifter for use with the electronic load testing system of FIG. 7.

Turning to FIG. 13, a gate drive method for transistor 126 is depicted with respect to a single load cell utilizing a digital drive 130 in parallel with a linear driver 132. When controlling a MOSFET, or similar power switch, with a linear driver, the gate voltage slews from 0V (or in some examples from a negative gate voltage) to a voltage level that will begin to turn the MOSFET on. This voltage level is known as the gate threshold voltage (also referred to as Vgs(th)). A finite time is required to linearly slew the driver output to Vgs(th). This delay causes a skew in duty cycle when switching loads at high frequencies. The example depicted of FIG. 13 reduces this delay time by utilizing a buffer output of a digital drive to quickly shift the gate voltage of the MOSFET, thereby resulting in higher accuracy in both the timing and the duty cycle. In some examples, digital drive 130 may be configured as a floating drive in series with linear driver 132, e.g., to provide for lower impedance driving the gate In operation, the gate drive signal is created by a resistive divider between an output of digital drive 130 (operating as a buffer gate) and an output of linear driver 132. This configuration operates in accordance with the following steps:

When the load switch is fully turned off, linear driver and buffer voltage are both at zero volts, ensuring that the load switch gate voltage is at a minimum.

To turn on the switch, a reference signal is applied to the linear driver and driver output voltage begins to rise.

Simultaneously, the buffer output is switched on quickly, e.g., on the order of a few nanoseconds or less.

The resulting divider output quickly shifts gate voltage to just below Vgs(th), minimizing the slew voltage and slew time required by the linear driver.

Gate voltage quickly slews to Vgs(th), turning on the MOSFET.

Rh may be replaced by a current source chosen to shift output voltage from minimum voltage to Vgs(th). This configuration has the added advantage that the linear driver slew rate is not slowed by the divider network.

Figure 14:
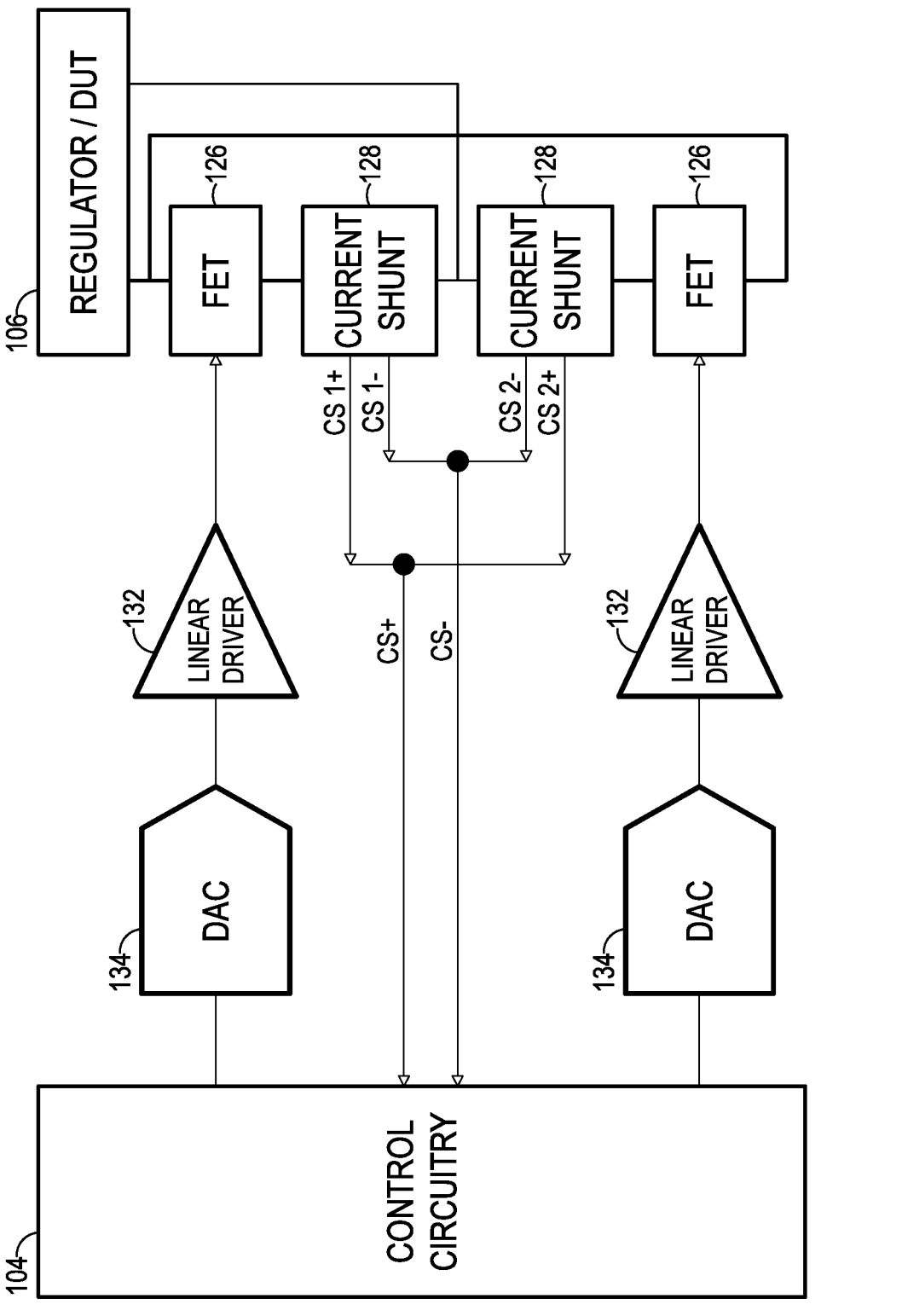
FIG. 14 depicts an example of an array of load cells driven by individual DAC outputs, using combined CS+ and CS– signals for use with the electronic load testing system of FIG. 7.

Other systems and methods may be utilized to increase the number of cells or decrease the number of connections per cell, such as the example is depicted in FIG. 14. As shown in FIG. 14, an array of digital-to-analog converter (DAC) outputs drives an array of load cells.

In the example depicted in FIG. 14, the load transistors are characterized for current versus gate drive voltage. These characteristics are digitally stored in a processor (e.g., in control module 104) that controls the output of two DACs 134. The DAC output voltage is stepped by control module 104 nonlinearly to create a linear load cell current, including programmed slew rate, fixed current, or an arbitrary waveform. The DAC output is programmed to compensate for MOSFET gain, capacitance, resistance nonlinearities, temperature effects, current sense resistor values, inductance, and any parasitic voltages of DUT 106. DAC compensation may be accomplished by a variety of methods, including look-up tables, programming equations, or other digital signal processing methods. For load transistors that are not well matched in Vgs(th) and transconductance, each load cell may have its own DAC and gate drive.

This process, along with separate CS+ and CS− signals for each cell, results in the actual load current more accurately reflecting the programmed current. However, load cells with digital compensation as described above can be made to reasonably match (within 20% or less) other load cells in current output, even if separate CS+ and CS− signals are not employed for individual load cell feedback. In this case, CS+ and CS− signals from multiple cells may be combined as shown in FIG. 14, significantly lowering the average pin requirement per cell. For example, five cells connected in parallel in this manner will utilize five gate signals but only single CS+ and CS− combined signals, for a combination of seven connections; equating to just 1.4 connections per cell. Utilizing this method, the number of cells that can be paralleled is effectively unlimited.

Figure 15:
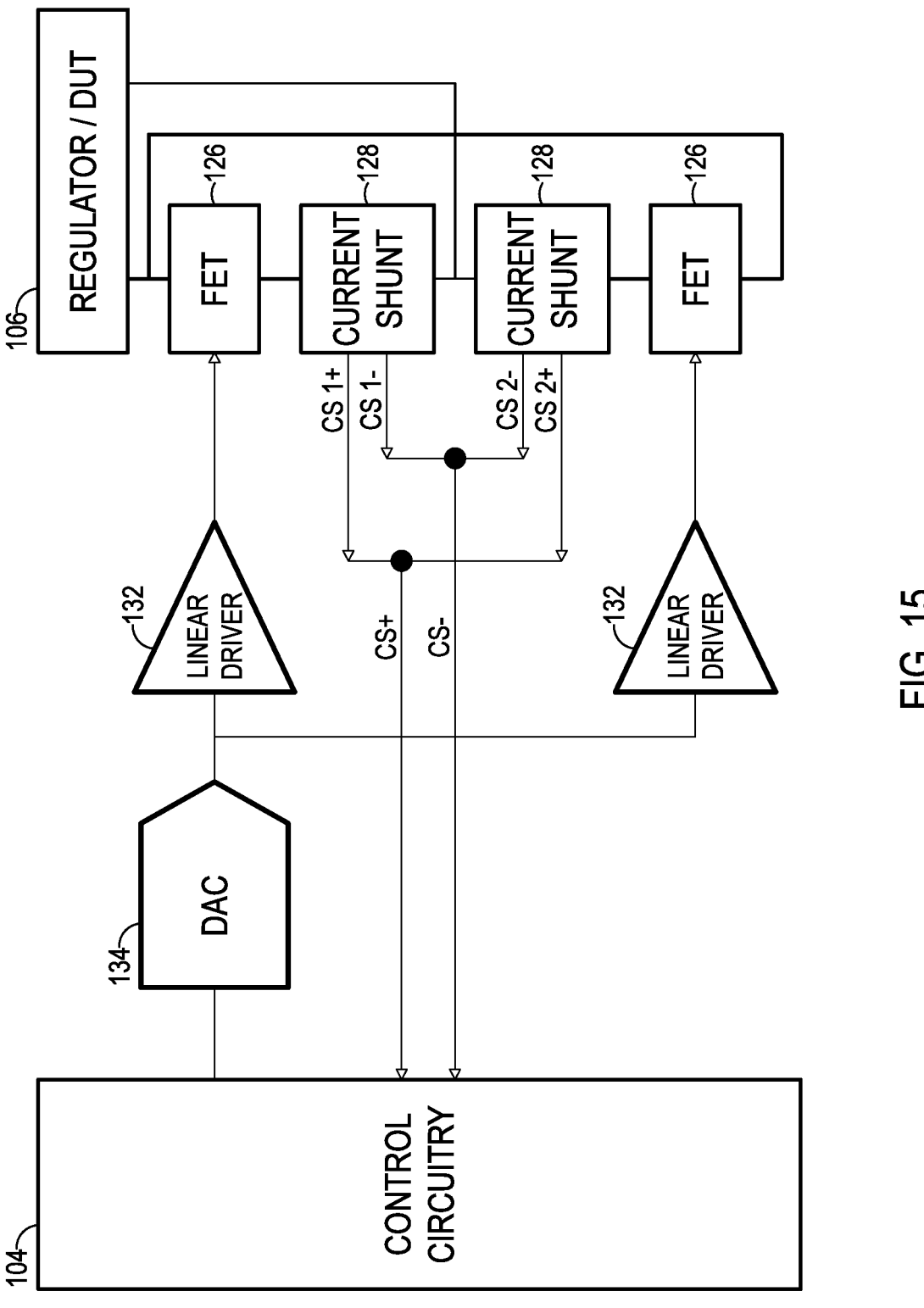
FIG. 15 depicts an example of an array of load cells driven by a common DAC output and employing combined CS+ and CS– signals for use with the electronic load testing system of FIG. 7.

Turning to FIG. 15, if the load transistors of different cells are reasonably matched in Vgs(th) and transconductance (e.g., within approximately 20%), a single DAC output and gate drive will be sufficient for controlling multiple load cells. For example, for a five-cell array, a single gate drive, CS+, and CS− signals are all that is necessary. This arrangement results in only three total connections for five load cells—equivalent to 0.6 connections per cell. Again, there is no minimum or maximum number of cells that can be combined in this way.

System 100 may further include the use of many types of analog and digital signals transmitted along PCB traces of bus 112. For example, system 100 may utilize connections between an instrument controller to the load controller (e.g., connections between a separate PC and control module 104), connections between load module 102 and a digital compensator, connections between the digital compensator and a gate of MOSFET 126, current sense and return connections, temperature measurement connections, load cell voltage sense connections, connections relating to PMBus, POK, AVS Bus, and/or other power management related signals, and analog, digital, and mixed signal forms of all of the above, as will be understood by those skilled in the art.

Figure 16:
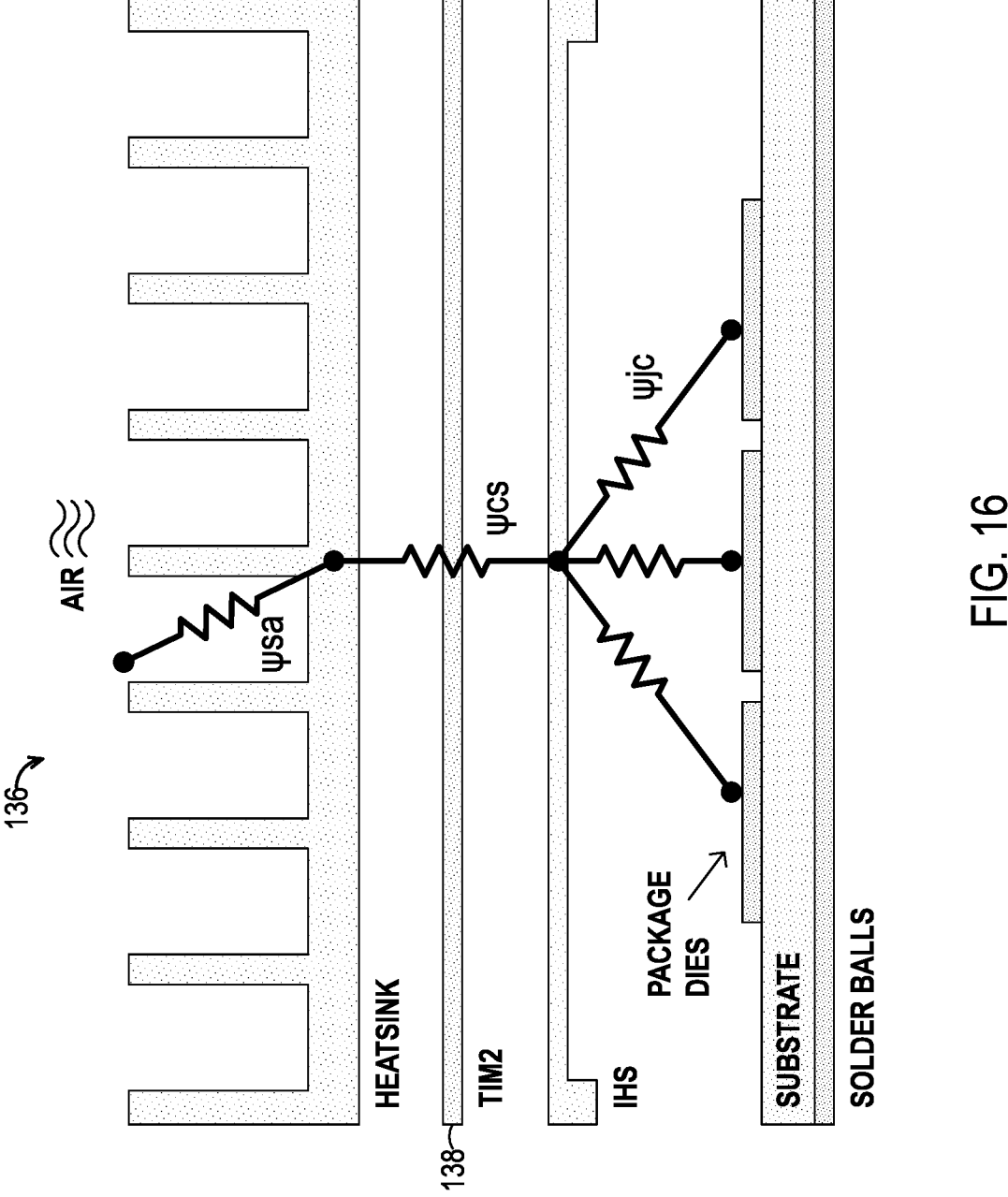
FIG. 16 is an example thermal solution in accordance with aspects of the present disclosure.

Turning to FIG. 16, system 100 being form factor equivalent is additionally advantageous for the utilization of a thermal solution in concert with load testing. For example, FIG. 16 depicts an illustrious thermal solution 136 utilized with system 100 for a large IC. As shown in FIG. 16, a second thermal interface layer 138 (see TIM2) is added between the IHS and heat sink. The heat sink may be air cooled, liquid (water, oil, heat pipe, or other) cooled, or any other method of cooling, as will be understood by those skilled in the art.

Large ICs typically have peak current requirements and thermal current requirements. Peak current requirements are related to process, applied voltage, operating frequency, and operational content. Operational content is the most variable, as the IC may be idling or have one or more portions operating, such as processor cores of various types, PHYs, or other functions.

Thermal current requirements are lower than peak current requirements and are related to the maximum amount of power that can be dissipated in the IC package. The thermal current represents long term average, with shorter bursts beyond that where the mass of the thermal management system can absorb temporary increases in power dissipation. Because the same peak and thermal currents of the load current correspond exactly to the ability of the thermal solution to dissipate heat, a form factor equivalent device is ideal for testing and evaluating both PDN and thermal solution together. Variable levels and durations of dissipation will allow more thorough and accurate testing of the thermal solution, leading to a more optimum total system performance.

Moreover, as the thermal solution is improved through use of system 100, those improvements may be translated back to increased electrical capacity of the PDN and especially of the IC performance itself. IC clock speeds, data throughput, use of more silicon area, and similar performance capacity is often related to the thermal solution. Accordingly, because of the integrated validation capabilities, system 100 helps maximize IC performance.

Testing the thermal solution is a function of all the load cells, especially the high current load cells, as they dissipate the most power. Conversely, while both load cell types are used to test PDN response and clocking, the very fast load cells have a unique application due to their high speed.

With respect to FIGS. 17 and 18, aspects of clocks and clock timing as it relates to system 100 will now be discussed. Lower limits of current rise and fall times of load cells are typically on the order of 200 ns, though are moving toward 50 ns and below. In contrast, load cells that are termed "very fast load cells" have rise and fall times of 1 ns or lower. This gives the very fast load cells the ability to induce very fast edge noise inside system 100 for testing internal decoupling, layout, clock, and data functions. To enable the fastest transition times, very fast load cells typically comprise a MOSFET switching a load resistor on and off. In some examples, edge times may be lengthened as needed to adjust for different use-cases. Furthermore, edge times below 1 ns also provide the ability to make time domain reflectometry (TDR) types of measurements, both internal and external to system 100.

Figure 17:
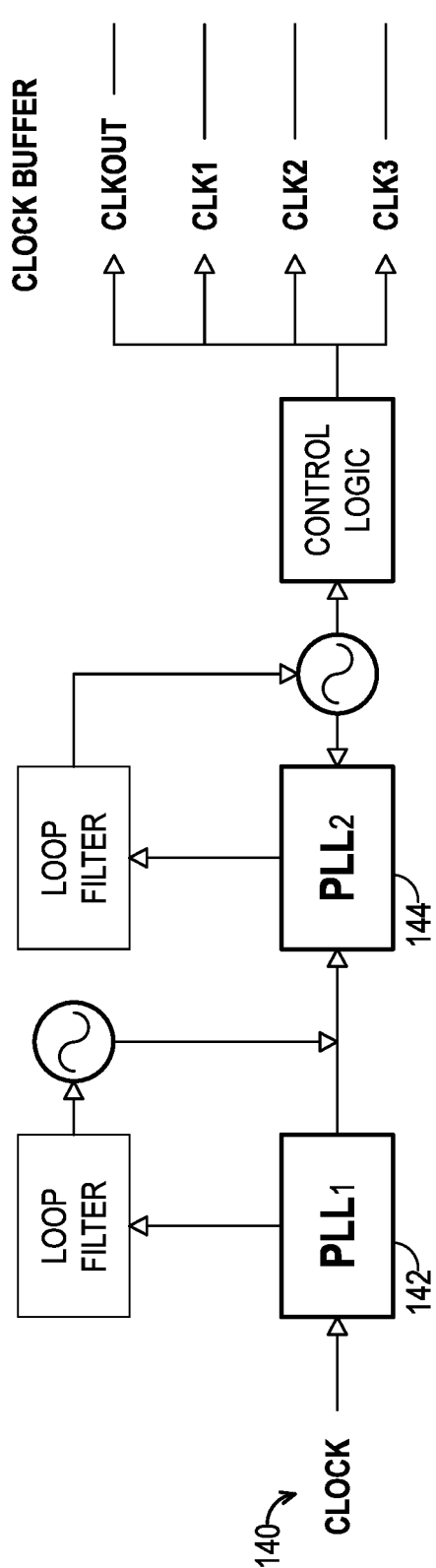
FIG. 17 is a block diagram depicting aspects of a clock for use with the device of FIG. 7.
Figure 18:
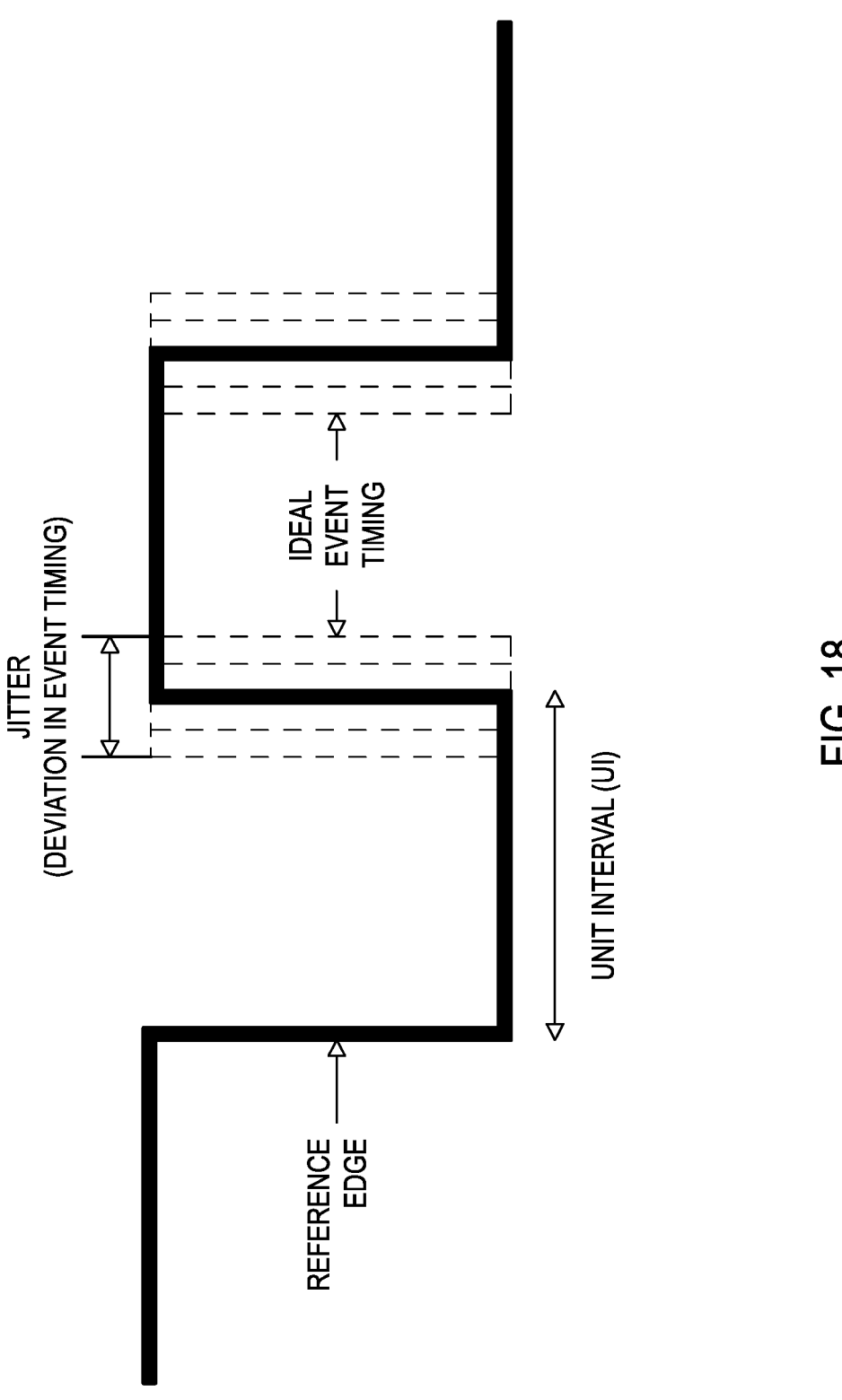
FIG. 18 depicts a timing pulse edge with jitter of the clock of FIG. 17.

Turning to FIG. 17, clock functions can be tested by placing a clock 140, phase lock loops 142, 144 (PLLs), and other clock related components such as timers, retimers, and routing, in similar locations in system 100 as an IC and system PCB layout. Susceptibility and immunity to noise can then be tested by exercising high current loads and the very fast load cells at various levels.

Clock jitter (see FIG. 18) and PLL synchronization can be tested with both common mode and differential mode methods. Differential mode is tested with noise on the clock or PLL power supply, noise coupled capacitively from an adjacent power supply, or electromagnetic coupling into the clock signal differentially.

To accomplish capacitive coupling, load cell 114 may be placed with a pad area connected to the MOSFET drain node of a very high-speed load cell. This pad is placed in proximity to the clock signal for coupling. Load current, frequency, and transition time can be adjusted to vary the amount of injection.

Inductive coupling is accomplished by placing a trace or loop in series with the MOSFET, in parallel with the clock signal. Again, load current, frequency, and transition time are adjusted to allow variable induction.

To test common mode noise, the capacitive pad coupling may be located near differential clock signals, and inductive common mode coupling would place the induction trace or loop (as described previously) in parallel with the same differential clock signals.

In the same way, data communications, such as memory bus, I/O signals, or any similar signals may be tested. Eye diagrams can be evaluated both with no load activity, and then with varying levels of load cell amplitude, frequency, and transition time. Both differential mode and common mode injection may be accomplished as has been previously described for clock evaluation.

Effectiveness of substrate capacitors and layout may be adequately tested with system 100. With existing load units, load cells are not on the substrate of the IC but are externally located. These existing load units are limited in their current slew rates due to inductive connections to the IC. Moreover, the existing load units typically plug into an interposer or other adapter where the IC would be located, and are not laid out the same as the IC and its substrates. As a result, existing load units are unable to accurately evaluate decoupling performance of internal IC decoupling solutions. In contrast, system 100 is designed with an IC equivalent substrate layout, decoupling capacitor size, number, and location, and load cells located where power consuming dies are to be mounted. They can therefore accurately evaluate an internal decoupling solution.

Additionally, by employing multiple load cells in multiple locations on the substrate, along with multiple voltage sense points for input voltage and ground, both the input voltage plane and ground plane may be evaluated and characterized. Load cells may be controlled to equal or proportional currents, or may be individually controlled, or may be intermodulated. This variability will influence current conduction magnitude and direction in different areas of the power and ground planes, thus allowing characterization.

Temperature sensors can be placed at various points in system 100, depending on application. With load cells located where power consuming IC dies are located, temperature sensors located concurrently will provide an equivalent thermal image of the inside of the IC. Moreover, this is interactive with the thermal solution and its evaluation. Various scenarios can be tested for short-term and long-term temperature and power dissipation. Furthermore, different die areas can be evaluated for maximum temperature and performance of each die, both individually and interactively as part of the overall system. System firmware and software can then be designed to work optimally according to thermal capabilities, resulting in increased performance of the IC.

In some examples, system 100 includes processing logic and/or has one or more computer-readable storage media having program instructions for testing operations stored therein. A processor of system 100 may be configured to process the program instructions, e.g., to initiate testing, record resulting test analytics to storage, and/or compile communication data for subsequent transmission. For example, system 100 may be configured to provide one or more testing scenarios such as power cycling, virus simulation, changes in load requirements, etc., and record any resulting analytical data. In some examples, system 100 is configured to operate autonomously. Accordingly, system 100 may be entirely preprogrammed, partially preprogrammed, and/or configured to receive real-time instructions, e.g., through the use of one or more of the above-mentioned wired and/or wireless technologies.

B. REFERENCE NUMERALS

The following reference numerals are used in the present written description and drawings:

10 integrated circuit (IC)
12 ball grid array (BGA) layer
14 multilayer substrate
16 die layers
18 thermal interface layer
20 integrated heat spreader (HIS) lid
22 system
24 socket
26 PCB
28 heat sink/cooling system
40 load testing system
42 device under test (DUT)
44 surface mounted connector
50 testing system
52 load module
54 DUT
56 socket
58 control module
59 interconnect cable
60 PCB
62 processor socket
64 memory sockets
66 bus/traces
100 load testing system
102 load module
104 control module
106 DUT
108 processor socket
110 memory socket
112 bus
114 load cell
116 clock buffer
118 flash memory
120 voltage-controlled crystal oscillator (VCXO)
122 temperature sensor
124 connection lines
126 transistor
128 current sense resistor
130 digital drive
132 linear driver
134 digital-to-analog convertor (DAC)
136 thermal solution 138 thermal interface layer
140 clock
142 phase lock loop
144 phase lock loop

C. ILLUSTRATIVE COMBINATIONS AND ADDITIONAL EXAMPLES

This section describes additional aspects and features of electronic load testing systems described herein, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below may expressly refer to and further limit other paragraphs, providing without limitation examples of some of the suitable combinations.

A1. An electronic load testing system, comprising:

a control module configured to be electrically coupled to a first location on a printed circuit board (PCB) assembly of an electronic assembly; and a load module configured to be electrically coupled to a second location on the PCB assembly, wherein the first location and the second location are spaced apart and in electronic communication via one or more traces of the PCB assembly;

the load module comprising a load cell configured to mimic a load by selectively conducting current from a power supply of the PCB assembly, the load cell comprising a transistor and a current sense resistor;

wherein the control module is configured to communicate with the load module via the one or more traces of the PCB assembly.

A2. The electronic load testing system of A1, wherein at least one of the first location and/or the second location comprises an integrated socket of the PCB.

A3. The electronic load testing system of A1 or A2, wherein the first location comprises a memory module socket and the second location comprises a processor socket.

A4. The electronic load testing system of any one of paragraphs AC through A3, wherein the load cell is a first load cell, and wherein the load module comprises at least a second load cell, such that the first load cell and the second load cell share a common negative current sense connection.

A5. The electronic load testing system of any one of paragraphs AC through A4, wherein the transistor comprises a metal-oxide semiconductor field-effect transistor (MOSFET).

A6. The electronic load testing system of any one of paragraphs AC through A5, wherein the control module includes a linear driver configured to generate a driving voltage applied to a gate of the transistor.

A7. The electronic load testing system of A6, wherein the linear driver is coupled to an output of a digital-to-analog converter such that the control module is configured to adjust for nonlinearities of the transistor.

A8. The electronic load testing system of any one of paragraphs AC through A7, wherein the load cell is a first load cell and the load module comprises at least a second load cell;

wherein the control module is configured to utilize respective linear drivers to generate driving voltages applied to respective transistors of the load cells; and wherein the first load cell and the second load cell share a common negative current sense connection and a common positive current sense connection.

A9. The electronic load testing system of A8, wherein the linear drivers are configured to utilize respective outputs of digital-to-analog converters to adjust for nonlinearities of the transistors.

A10. The electronic load testing system of A8, wherein the linear drivers are configured to utilize an output of a same digital-to-analog converter to adjust for nonlinearities of the transistors.

A11. The electronic load testing system of any one of paragraphs AC through A10, further comprising a temperature sensor, wherein the electronic load testing system is configured to measure one or more thermal management properties of the electronic assembly using the temperature sensor.

A12. The electronic load testing system of any one of paragraphs AC through A11, further comprising the electronic assembly, wherein the electronic load testing system is coupled to the electronic assembly, and wherein the electronic assembly comprises a computer motherboard, the first location is a memory module socket, the second location is a processor socket, and the one or more traces comprise a data bus of the motherboard.

B0. A form factor equivalent device (FFED) for evaluating performance of various solutions for large integrated circuits (ICs).

B1. The device of paragraph B0, wherein the physical dimensions of the FFED are similar to (configured to mimic) the IC to allow installation in the same place and manner as the IC is installed.

B1A. The device of paragraph B1, wherein footprint dimensions (X-Y) of the FFED are within 5% of corresponding footprint dimensions of the IC.

B2. The device of paragraph BC or B1 or B1A, wherein a package construction of the device comprises materials having substantially identical thermal properties and conductive properties as the IC to allow equivalent performance for evaluation.

B3. The device of any one of paragraphs BC through B2, wherein thermal characteristics are similar to (configured to mimic) the IC.

B4. The device of any one of paragraphs BC through B3, wherein the mounting PCB is similar to (configured to mimic) the IC mounting PCB.

B5. The device of any one of paragraphs BC through B4, wherein a substrate is laid out similar to (configured to mimic) the IC.

B6. The device of any one of paragraphs BC through B5, wherein electrical resistances, capacitances, and inductances are similar to (configured to mimic) the IC.

B7. The device of any one of paragraphs BC through B6, further comprising at least one high current load cell.

B8. The device of any one of paragraphs BC through B7, further comprising at least one very fast load cell having a rise time of 1 ns or less.

B9. The device of any one of paragraphs BC through B8, further comprising at least one voltage measurement point for incoming power.

B10. The device of any one of paragraphs BC through B9, further comprising at least one voltage measurement point for power return.

B11. The device of any one of paragraphs BC through B10, further comprising at least one clock.

B12. The device of any one of paragraphs BC through B11, further comprising at least one external clock connection.

B13. The device of any one of paragraphs BC through B12, further comprising at least one external data connection.

B14. The device of any one of paragraphs BC through B13, further comprising at least one internal bypass capacitor.

B15. The device of any one of paragraphs BC through B14, further comprising at least one temperature sensor.

B16. The device of any one of paragraphs BC through B15, further comprising a plurality of high current load cells and a plurality of temperature sensors, the plurality of high current load cells and the plurality of temperature sensors configured to evaluate and characterize the thermal properties of the device, the ICs, and thermal solution.

B17. The device of paragraph B16, wherein the plurality of high current load cells are modulated both individually and together to mimic power consumption in an IC.

B18. The device of any one of paragraphs B0 through B17, wherein ADC and DAC circuitry is integrated into the package.

B19. The device of any one of paragraphs B0 through B118, further configured to incorporate digital signals.

B20. The device of any one of paragraphs B0 through B19, further configured to incorporate analog signals.

B21. The device of any one of paragraphs B0 through B20, further configured to communicate via an analog signal.

B22. The device of any one of paragraphs B0 through B21, further configured to communicate via a PCB digital bus.

B23. The device of any one of paragraphs B0 through B21, further configured to communicate and/or receive electronic power via an external cable.

B25. The device of any one of paragraphs B1 through B21, further configured to communicate and/or receive electronic power via a combined power and data cable, such as a universal serial bus (USB) cable, IEEE 1394 (also referred to as FireWire) cable, Thunderbolt cable, etc.

B26. The device of any one of paragraphs B0 through B25, further configured to be powered via a PCB power rail (also referred to as a power plane).

B27. The device of any one of paragraphs B0 through B26, further configured to communicate via an ethernet cable.

B28. The device of any one of paragraphs B0 through B27, configured to communicate wirelessly.

B29. The device of B28, configured to communicate utilizing a Bluetooth connection.

B30. The device of B28, configured to communicate utilizing a Wi-Fi connection.

B31. The device of B28, configured to communicate utilizing a wireless mesh network.

B32. The device of B31, configured to communicate utilizing a zigbee connection.

B33. The device of B28, configured to communicate utilizing a wireless sensor network.

B33. The device of any one of paragraphs B0 through B27, configured to communicate via a fiber-optic cable.

B34. The device of any one of paragraphs B0 through B33, further comprising a battery power supply.

B35. The device of any one of paragraphs B0 through B34, further comprising a power supply including one or more photovoltaic cells.

B36. The device of any one of paragraphs B0 through B35, wherein the device is preprogrammed and configured to operate autonomously.

C0. The device of paragraph B7, further comprising a plurality of high current load cells and voltage sense points on input voltage and ground, configured to evaluate and characterize internal and external power distribution.

C1. The device of paragraph C0, configured to evaluate clock performance due to noise on the power source.

C2. The device of either one of paragraph C0 or C1, the device further configured to utilize a pad, trace, or loop to evaluate clock performance.

C3. The device of any one of paragraphs C0 through C2, configured to evaluate data performance.

C4. The device of any one of paragraphs C0 through C3, which is used to evaluate data performance due to noise on the power source.

C5. The device of any one of paragraphs C0 through C4, which uses a pad, trace, or loop to evaluate data performance.

D0. The device of paragraph B8, where the very fast load cell is used to evaluate clock performance.

D1. The device of paragraph D0, which is used to evaluate clock performance due to noise on the power source.

D2. The device of either one of paragraphs D0 or D1, which uses a pad, trace, or loop to evaluate clock performance.

D3. The device of any one of paragraphs D0 through D2, wherein the very fast load cell is used to evaluate data performance.

D4. The device of any one of paragraphs D0 through D3, which is used to evaluate data performance due to noise on the power source.

D5. The device of any one of paragraphs D0 through D4, which uses a pad, trace, or loop to evaluate data performance.

D6. The device of any one of paragraphs D0 through D5, wherein the very fast load cell is used to perform Time Domain Reflectometry (TDR) measurements both internally in the FFED and externally onto the PCB and Power Domain Network.

E0. A load testing system comprising a control circuit and a load circuit where the control circuit is located at one point of a PCB assembly and the load circuit is located at a second point of the PCB assembly; and wherein existing traces of the PCB are used to communicate between the control circuit and load circuit.

E1. The load testing system of paragraph E0, wherein the control circuit and/or the load circuit are located at and connected to integrated circuit sockets.

E2. The load testing system of paragraph E0 or E1, wherein the control circuit and/or the load circuit are located at and connected to module connectors.

E3. The load testing system of any one of paragraphs E0 through E2, wherein the control circuit and/or the load circuit are located at and connected to integrated circuit PCB footprints.

E4. The load testing system of any one of paragraphs E0 through E3, further comprising:

a plurality of control circuits and/or a plurality of load circuits; and wherein existing PCB traces are used to communicate between any parts of the load testing system.

E5. The load testing system of any one of paragraphs E0 through E4, further including a load cell, wherein the load cell comprises: a controller, a MOSFET, a current sense resistor, and gate and current sense connections.

E6. The load testing system of paragraph E5, including two or more of the load cells, wherein the two or more load cells utilize a common current sense connection.

E7. The load testing system of any one of paragraphs E0 through E6, wherein the controller employs a DAC output to compensate for MOSFET nonlinearities and parasitic components.

E8. The load testing system of any one of paragraphs E0 through E7, wherein two or more load cells use a common current sense positive signal.

E9. The load testing system of any one of paragraphs E0 through E8, wherein the controller employs a linear gate drive with a digital level shifter.

F0. An electronic load testing system configured to emulate aspects of an integrated circuit (IC), the testing system comprising:

a control module configured to be electrically coupled to a first location on a printed circuit board (PCB) of an electronic assembly; and a load module configured to be electrically coupled to a second location on the PCB, the load module comprising a load cell configured to selectively conduct current from a power supply of the electronic assembly, the load cell comprising a transistor and a current sense resistor;

wherein the first location and the second location are spaced apart and in electronic communication via one or more traces of the PCB;

wherein the control module is configured to communicate with the load module via the one or more traces of the PCB; and wherein the load module and the IC have an equivalent form factor (e.g., an X-Y footprint of the load module is the same as an X-Y footprint of the IC within a 5% tolerance).

F1. The electronic load testing system of F0, wherein the load module is configured to have substantially the same thermal properties as the IC.

F2. The electronic load testing system of F1, further comprising a temperature sensor, wherein the electronic load testing system is configured to measure one or more thermal management properties of the electronic assembly using the temperature sensor.

F3. The electronic load testing system of any one of paragraphs F0 through F2, further comprising the electronic assembly;

wherein the electronic load testing system is coupled to the electronic assembly; and wherein the electronic assembly comprises a computer motherboard, the first location is a memory module socket, the second location is a processor socket, and the one or more traces comprise a data bus of the motherboard.

F4. The electronic load testing system of any one of paragraphs F0 through F3, wherein the load cell is a first load cell, the load module further comprising a second load cell sharing a common negative current sense connection with the first load cell.

F5. The electronic load testing system of any one of paragraphs F0 through F4, wherein the control module is physically separate from the load module.

G0. A method of testing a characteristic of an electrical system utilizing the electronic load testing system of any one of paragraphs A1 through A12, wherein the electrical system includes the PCB of the electronic assembly, the method comprising:

causing a current in the load cell by transmitting a drive signal from the control module to a gate of the transistor via one or more of the traces of the PCB assembly;

measuring a voltage across the current sense resistor using the control module via one or more of the traces; and assessing the characteristic of the electrical system by comparing the measured voltage to an expected voltage.

G1. The method of G0, wherein physical dimensions of a footprint of the load cell are similar to (configured to mimic) an integrated circuit (IC) of the electrical system (e.g., within 5%), and the method further comprises installing the load cell in a same place and manner as the IC is normally installed.

H0. A method of testing an electrical characteristic of an electrical system, the method comprising:

transmitting a drive signal from a control module coupled to the electrical system at a first location to a gate of a transistor of a load cell coupled to the electrical system at a second location, wherein the first location and the second location are spaced apart and in electronic communication via one or more traces of the electrical system;

measuring a voltage across a current sense resistor of the load cell using the control module via the one or more traces; and assessing the characteristic of the electrical system by comparing the measured voltage to an expected voltage.

H1. The method of H0, wherein physical dimensions of a footprint of the load cell are similar to (configured to mimic) an integrated circuit (IC) normally installed at the second location of the electrical system (e.g., within 5%), and the method further comprises coupling the load cell to the electrical system at the second location in a same manner as the IC would be.

H2. The method of H0 or H1, wherein a height of the load cell is within 5% of a height of the IC.

H3. The method of any one of paragraphs H0 through H2, wherein physical dimensions of a footprint of the load module are configured to mimic an integrated circuit (IC) normally installed at the second location of the electrical system, and the method further comprises coupling the load module to the electrical system at the second location in a same manner as the IC would be.

H4. The method of any one of paragraphs H0 through H3, wherein the second location comprises an integrated socket of the electrical system.

H5. The method of any one of paragraphs H0 through H4, wherein the transistor comprises a metal-oxide semiconductor field-effect transistor (MOSFET).

H6. The method of any one of paragraphs H0 through H5, further comprising generating the drive signal with a linear driver of the control module.

H7. The method of H6, further comprising adjusting for nonlinearities of the transistor by coupling an output of a digital-to-analog converter to an input of the linear driver.

H8. The method of any one of paragraphs H0 through H7, further comprising measuring one or more thermal management properties of the electrical system using a temperature sensor.

H9. The method of any one of paragraphs H0 through H8, wherein the load cell is a first load cell and the method further comprises:

transmitting the drive signal from the control module to a respective gate of a respective transistor of at least a second load cell of the load module; and wherein the first load cell and the second load cell share a common negative current sense connection.

ADVANTAGES, FEATURES, AND BENEFITS

The different embodiments and examples of the electronic load testing system described herein provide several advantages over known solutions for testing power systems of an electrical module. For example, illustrative embodiments and examples described herein meet present and future increasing current and current step requirements for high transient electronic loads.

Additionally, and among other benefits, illustrative embodiments and examples described herein implement and coordinate multiple loads for socket, module, board, and system level power systems.

Additionally, and among other benefits, illustrative embodiments and examples described herein are configured to fit in existing mechanical form factors.

Additionally, and among other benefits, illustrative embodiments and examples described herein make use of existing buses and interconnects reduce excessive cabling between load control circuitry and load power circuitry.

Additionally, and among other benefits, illustrative embodiments and examples described herein control as many individual load cells as possible utilizing available PCB connections.

Additionally, and among other benefits, illustrative embodiments and examples described herein allow for the simultaneous testing of all power related components of large systems comprising a plurality of modules under operating parameters similar to those of regular and strenuous use.

Additionally, and among other benefits, illustrative embodiments and examples described herein allow for time domain reflectometry (TDR) types of measurements.

Other, existing load systems cannot perform all of the herein described functions, as they utilize standardized load cells configured to connect to the socket either by cables or by interposers. At best, some custom load systems are performing DC and dynamic loading in a package that can solder to the main PCB or be inserted into a socket, however, these are not form factor equivalent, are not laid out identically to the IC substrate with equivalent load locations, parasitic impedances, decoupling solution, and are not able to be installed in a system identically to the IC.

No known system or device can perform these functions. However, not all embodiments and examples described herein provide the same advantages or the same degree of advantage.

CONCLUSION

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

The invention claimed is:

1. An electronic load testing system, comprising:
   a control module configured to be electrically coupled to a first location on a printed circuit board (PCB) assembly of an electronic assembly; and
   a load module configured to be electrically coupled to a second location on the PCB assembly, wherein the first location and the second location are spaced apart and in electronic communication via one or more traces of the PCB assembly;
   the load module comprising a load cell configured to mimic a load by selectively conducting current from a power supply of the PCB assembly, the load cell comprising a transistor and a current sense resistor;
   wherein the control module is configured to communicate with the load module via the one or more traces of the PCB assembly.

2. The electronic load testing system of claim 1, wherein at least one of the first location and/or the second location comprises an integrated socket of the PCB.

3. The electronic load testing system of claim 1, wherein the first location comprises a memory module socket and the second location comprises a processor socket.

4. The electronic load testing system of claim 1, wherein the load cell is a first load cell; and
   wherein the load module comprises at least a second load cell, such that the first load cell and the second load cell share a common negative current sense connection.

5. The electronic load testing system of claim 1, wherein the transistor comprises a metal-oxide semiconductor field-effect transistor (MOSFET).

6. The electronic load testing system of claim 1, wherein the control module includes a linear driver configured to generate a driving voltage applied to a gate of the transistor.

7. The electronic load testing system of claim 6, wherein the linear driver is coupled to an output of a digital-to-analog converter such that the control module is configured to adjust for nonlinearities of the transistor.

8. The electronic load testing system of claim 1, wherein the load cell is a first load cell and the load module comprises at least a second load cell;
   wherein the control module is configured to utilize respective linear drivers to generate driving voltages applied to respective transistors of the load cells; and
   wherein the first load cell and the second load cell share a common negative current sense connection and a common positive current sense connection.

9. The electronic load testing system of claim 8, wherein the linear drivers are configured to utilize respective outputs of digital-to-analog converters to adjust for nonlinearities of the transistors.

10. The electronic load testing system of claim 8, wherein the linear drivers are configured to utilize an output of a same digital-to-analog converter to adjust for nonlinearities of the transistors.

11. The electronic load testing system of claim 1, further comprising a temperature sensor, wherein the electronic load testing system is configured to measure one or more thermal management properties of the electronic assembly using the temperature sensor.

12. The electronic load testing system of claim 1, further comprising the electronic assembly, wherein the electronic load testing system is coupled to the electronic assembly, and wherein the electronic assembly comprises a computer motherboard, the first location is a memory module socket, the second location is a processor socket, and the one or more traces comprise a data bus of the motherboard.

13. A method of testing a characteristic of an electrical system utilizing the electronic load testing system of claim 1, wherein the electrical system includes the PCB of the electronic assembly, the method comprising:

causing a current in the load cell by transmitting a drive signal from the control module to a gate of the transistor via one or more of the traces of the PCB assembly;

measuring a voltage across the current sense resistor using the control module via one or more of the traces; and assessing the characteristic of the electrical system by comparing the measured voltage to an expected voltage.

14. An electronic load testing system configured to emulate aspects of an integrated circuit (IC), the testing system comprising:

a control module configured to be electrically coupled to a first location on a printed circuit board (PCB) of an electronic assembly; and a load module configured to be electrically coupled to a second location on the PCB, the load module comprising a load cell configured to selectively conduct current from a power supply of the electronic assembly, the load cell comprising a transistor and a current sense resistor;

wherein the first location and the second location are spaced apart and in electronic communication via one or more traces of the PCB;

wherein the control module is configured to communicate with the load module via the one or more traces of the PCB; and wherein the load module and the IC have a same footprint.

15. The electronic load testing system of claim 14, wherein the load module is configured to have substantially the same thermal properties as the IC.

16. The electronic load testing system of claim 15, further comprising a temperature sensor, wherein the electronic load testing system is configured to measure one or more thermal management properties of the electronic assembly using the temperature sensor.

17. The electronic load testing system of claim 14, further comprising the electronic assembly;

wherein the electronic load testing system is coupled to the electronic assembly; and wherein the electronic assembly comprises a computer motherboard, the first location is a memory module socket, the second location is a processor socket, and the one or more traces comprise a data bus of the motherboard.

18. The electronic load testing system of claim 14, wherein the load cell is a first load cell, the load module further comprising a second load cell sharing a common negative current sense connection with the first load cell.

19. The electronic load testing system of claim 14, wherein the control module is physically separate from the load module.

\* \* \* \* \*